(12) United States Patent
Fukui et al.

(10) Patent No.: US 8,895,958 B2
(45) Date of Patent: Nov. 25, 2014

(54) LIGHT EMITTING ELEMENT AND METHOD FOR MANUFACTURING SAME

(75) Inventors: Takashi Fukui, Sapporo (JP); Katsuhiro Tomioka, Sapporo (JP)

(73) Assignees: National University Corporation Hokkaido University, Hokkaido (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/513,082

(22) PCT Filed: Jun. 4, 2010

(86) PCT No.: PCT/JP2010/003762
§ 371 (c)(1),
(2), (4) Date: May 31, 2012

(87) PCT Pub. No.: WO2011/067872
PCT Pub. Date: Jun. 9, 2011

(65) Prior Publication Data
US 2012/0235117 A1    Sep. 20, 2012

(30) Foreign Application Priority Data

Dec. 1, 2009    (JP) ................... 2009-273561

(51) Int. Cl.
*H01L 29/06*    (2006.01)
*H01L 33/00*    (2010.01)
(Continued)

(52) U.S. Cl.
CPC .................. *H01S 5/341* (2013.01); *B82Y 20/00* (2013.01); *H01L 21/02381* (2013.01); *H01S*
(Continued)

(58) Field of Classification Search
CPC ............ H01L 29/0669; H01L 29/0676; H01L 2221/1094; H01L 21/02603
USPC ........... 257/12, 13, 14, 79, 80, 81, 82, 83, 84, 257/85, 86, 87, 88, 89, 90, 91, 92, 93, 94, 257/95, 96, 97, 98, 99, 100, 101, 102, 103
See application file for complete search history.

(56) References Cited

U.S. PATENT DOCUMENTS 7,352,066 B2 *  4/2008  Budd et al. .................... 257/774
7,539,385 B2    5/2009  Uetake et al.
(Continued)

FOREIGN PATENT DOCUMENTS

EP    1 804 350 A1    7/2007
JP    10-321910 A    12/1998
(Continued)

OTHER PUBLICATIONS

Vincenzo Palermo; Creation of Nanometre-Scale Islands, Wires and Holes on Silicon Surfaces for Microelectronics; Mar. 2003; University of Bologna; pp. 19, 20 & 50.*

(Continued)

*Primary Examiner* — Matthew W Such
*Assistant Examiner* — Samuel Lair
(74) *Attorney, Agent, or Firm* — Birch, Stewart, Kolasch & Birch, LLP

(57) ABSTRACT

Disclosed is a light emitting element, which emits light with small power consumption and high luminance. The light emitting element has: a IV semiconductor substrate; two or more core multi-shell nanowires disposed on the IV semiconductor substrate; a first electrode connected to the IV semiconductor substrate; and a second electrode, which covers the side surfaces of the core multi-shell nanowires, and which is connected to the side surfaces of the core multi-shell nanowires. Each of the core multi-shell nanowires has: a center nanowire composed of a first conductivity type III-V compound semiconductor; a first barrier layer composed of the first conductivity type III-V compound semiconductor; a quantum well layer composed of a III-V compound semiconductor; a second barrier layer composed of a second conductivity type III-V compound semiconductor; and a capping layer composed of a second conductivity type III-V compound semiconductor.

15 Claims, 18 Drawing Sheets

(51) Int. Cl.

| | | |
|---|---|---|
| *H01L 21/00* | (2006.01) | |
| *B82Y 20/00* | (2011.01) | |
| *H01L 21/02* | (2006.01) | |
| *H01S 5/34* | (2006.01) | |
| *H01L 33/08* | (2010.01) | |
| *H01L 33/06* | (2010.01) | |
| *H01S 5/10* | (2006.01) | |
| *H01L 33/18* | (2010.01) | |
| *H01L 33/24* | (2010.01) | |

(52) U.S. Cl.
CPC .. *5/105* (2013.01); *H01L 21/02488* (2013.01); *H01L 21/02546* (2013.01); *H01S 5/3428* (2013.01); *H01L 21/02639* (2013.01); *H01L 33/08* (2013.01); *H01L 21/0262* (2013.01); *H01L 33/18* (2013.01); *H01L 2933/0083* (2013.01); *H01S 5/1042* (2013.01); *H01L 21/02603* (2013.01); *H01L 33/24* (2013.01); *H01L 21/02463* (2013.01); *H01L 33/06* (2013.01)
USPC ............ 257/14; 438/34; 438/47; 257/E51.04; 257/E33.008; 257/E33.012; 257/12; 257/13; 257/79; 257/94; 257/96; 257/97

(56) References Cited

U.S. PATENT DOCUMENTS

| | | | |
|---|---|---|---|
| 7,619,238 B2 | 11/2009 | Gaska et al. | |
| 7,880,318 B1 * | 2/2011 | Kamins et al. | 257/798 |
| 8,309,439 B2 * | 11/2012 | Seifert et al. | 438/478 |
| 2005/0006673 A1 | 1/2005 | Samuelson et al. | |
| 2008/0036038 A1 * | 2/2008 | Hersee et al. | 257/615 |
| 2009/0321782 A1 * | 12/2009 | Wang et al. | 257/103 |
| 2010/0019252 A1 * | 1/2010 | Bratkovski et al. | 257/80 |
| 2010/0155767 A1 * | 6/2010 | Lee et al. | 257/99 |
| 2010/0304204 A1 * | 12/2010 | Routkevitch et al. | 429/122 |
| 2010/0327258 A1 | 12/2010 | Lee et al. | |
| 2011/0254034 A1 * | 10/2011 | Konsek et al. | 257/98 |
| 2011/0278539 A1 * | 11/2011 | Bangsaruntip et al. | 257/14 |
| 2012/0056237 A1 * | 3/2012 | Choi et al. | 257/103 |
| 2012/0068153 A1 * | 3/2012 | Seong et al. | 257/13 |

FOREIGN PATENT DOCUMENTS

| | | |
|---|---|---|
| JP | 2002-249400 A | 9/2002 |
| JP | 2008-177405 A | 7/2008 |
| JP | 2008-049209 A | 3/2009 |
| JP | 2009-76896 A | 4/2009 |
| JP | 2009-129941 A | 6/2009 |
| JP | 2009-147140 A | 7/2009 |
| KR | 10-2009-0003840 A | 1/2009 |
| WO | WO 2004/088755 A1 | 10/2004 |
| WO | WO 2008/079079 A1 | 7/2008 |

OTHER PUBLICATIONS

International Search Report for PCT/JP2010/003762 dated Jul. 27, 2010.

Tomioka et al., "Selective-area growth of vertically aligned GaAs and GaAs/AlGaAs core-shell nanowires on Si(111) substrate", Nanotechnology vol. 20, No. 14, Apr. 8, 2009, pp. 1-8, IOP Publishing.

* cited by examiner

LIGHT EMITTING ELEMENT AND METHOD FOR MANUFACTURING SAME

TECHNICAL FIELD

The present invention relates to a light emitting element that includes nanowires formed of III-V compound semiconductors, and to a manufacturing method therefor.

BACKGROUND ART

A semiconductor light emitting element, such as a light emitting diode or a semiconductor laser, has a general structure wherein an n-type semiconductor and a p-type semiconductor are junctioned together on a semiconductor substrate. Such a light emitting element emits light by employing a radiative recombination of electron-hole pairs, which occurs at a p-n junction. The semiconductor material mainly employed for the light emitting element is a III-V compound semiconductor. This is because the bandgaps (the forbidden bands) of many III-V compound semiconductors are located in the visible light region. Another reason is that, with the development of crystal growth technology in recent years, a quantum well structure, including the p-n junction of the III-V compound semiconductors, can be easily fabricated.

Currently, there are two problems to be solved for the semiconductor light emitting element. The first problem concerns the reduction of power consumption. This problem with the semiconductor light emitting element is requires a high consumption of power, although the device lifetime is comparatively longer than that of lighting equipment that employs a filament or a fluorescent tube, this requires a high consumption of power. The second problem concerns the provision of high luminescence. Since, essentially, these two problems conflict with each other, these problems cannot be simultaneously solved for a conventional light emitting device having a planar p-n junction. That is, for a conventional light emitting element having a planar p-n junction, if the area of the p-n junction is increased in order to increase the luminescence, power consumption and self-absorption would be increased and the effective luminous efficiency would be reduced. And in order to reduce the power consumption, if the injection rate for a current is reduced, the luminescence would be lowered.

As a structure with which these two problems could possibly be solved simultaneously, the focus to date has been on a nanoscale semiconductor structure, such as a semiconductor nanowire structure. Since a semiconductor nanowire has a large ratio of height to diameter, the semiconductor nanowire is characterized in that self-absorption is low, and most of the light that is generated can easily be emitted outside. Therefore, when semiconductor nanowires are employed, the luminous efficiency can be greatly improved. Furthermore, since a semiconductor nanowire has a very small diameter (width), only low-current injection is required for obtaining a radiative recombination of electron-hole pairs. Up to the present, various light emitting elements that employ semiconductor nanowires have been proposed (see, for example, patent document 1 to 6).

In patent document 1, a method is described whereby a p-n junction is formed in the direction of growth (the longitudinal direction) of semiconductor nanowires to fabricate a light emitting element. According to the method in patent literature 1, the VLS method is employed for the fabrication of nanowires.

In patent document 2 and 3, fabrication methods are described for a light emitting element wherein a quantum well structure is provided for nanowires. According to these methods, a p-n junction is formed in the direction of growth of nanowires, and a nano-layer, which is formed of a semiconductor having a smaller bandgap than a p-n junction, is inserted to the p-n junction, so that a quantum well structure is provided in the direction of growth for nanowires. Moreover, according to the method described in patent document 3, the passivation effect on the surface of the semiconductor is employed together with the growth of crystal in the radial direction, so that the luminescence intensity is increased. For the methods in patent document 2 and 3, nanowires are fabricated by employing the VLS method.

In patent document 4 and 5, a light emitting element that has a p-i-n junction in the direction of growth for nanowires is described.

In patent document 6, a method is described whereby a plurality of semiconductor nanowires, which differ in compositions and bandgaps, are formed on a single substrate simultaneously to fabricate a light emitting array composed of a red light emitting element, a green light emitting element, and a blue light emitting element. According to this method, a difference in the diffusion lengths, at which the individual materials travel across an insulating film during the growth of crystal, is used, and a plurality of semiconductor nanowires having different compositions and bandgaps are simultaneously formed on a single substrate.

CITATION LIST

Patent Document

PTD 1: US Patent Application Publication No. 2005/006673
PTD 2: International Publication No. WO2004/088755
PTD 3: International Publication No. WO2008/079079
PTD 4: Japanese Patent Laid-Open No. 2009-129941
PTD 5: Japanese Patent Laid-Open No. 2009-147140
PTD 6: Japanese Patent Laid-Open No. 2009-049209

SUMMARY OF INVENTION

Technical Problem

However, there is a problem for the light emitting elements in patent document 1 to 6 in that the cross section of a p-n junction (a p-i-n junction) is the same size as the radially cross section of the nanowire, and the resistance is great, so that high luminescence and low power consumption cannot be satisfactorily achieved. Further, for the light emitting element in patent document 1 to 4, there is another problem in that multiple nanowires cannot be arranged at a high density, so that high luminescence and low power consumption cannot be appropriately achieved. Moreover, for the light emitting elements in patent document 1 to 3 using VLS method, there is an additional problem in that a metal catalyst enters the nanowires and increases resistance, so that low power consumption cannot be appropriately achieved.

While taking these problems into account, one advantage of the present invention is to provide a light emitting element that performs light emission with low power consumption and at high luminescence, and a fabrication method therefor.

Solution to Problem

The present inventors found a solution to the above-described problems by 1) fabricating, on the (111) surface of a group IV semiconductor substrate, nanowires formed of III-V compound semiconductors, 2) employing a core-multishell structure for the nanowires, and 3) covering the side surfaces of the nanowires with a metal electrode, and then continued more study to complete the present invention.

That is, first of all, the present invention relates to the following light emitting element.

[1] A light emitting element comprising:
a group IV semiconductor substrate that has a (111) surface and is doped with a first conductivity type;
an insulating film, which has either one opening or two or more openings, and covers the (111) surface of the group IV semiconductor substrate;
either one core-multishell nanowire or two or more core-multishell nanowires, formed of III-V compound semiconductors and arranged on the insulating film;
a first electrode connected to the group IV semiconductor substrate; and
a second electrode, connected to the side surfaces of the core-multishell nanowires, for covering the side surfaces of the core-multishell nanowires,
wherein each of the core-multishell nanowires includes
a center nanorod, formed using a III-V compound semiconductor of the first conductivity type and extending upward from the (111) surface of the group IV semiconductor substrate through one of the openings,
a first barrier layer, formed using a III-V compound semiconductor of the first conductivity type that has a bandgap greater than that of the III-V compound semiconductor used to form the center nanorod, for covering the side surfaces of the center nanorods on the insulating film;
a quantum well layer, formed using a III-V compound semiconductor that has a bandgap smaller than that of the III-V compound semiconductor used to form the first barrier layer, for covering the first barrier layer;
a second barrier layer, formed using a III-V compound semiconductor of a second conductivity type, which differs from the first conductivity type, that has the same composition as the III-V compound semiconductor used to form the first barrier layer, for covering the quantum well layer, and
a capping layer, which has a layer formed of a III-V compound semiconductor of the second conductivity type, and covers the second barrier layer to enable a connection to the second electrode by ohmic contact.

[2] The light emitting element according to [1], wherein a longitudinal axis of the center nanorod is substantially perpendicular to the (111) surface of the group IV semiconductor substrate.

[3] The light emitting element according to [1] or [2], wherein the III-V compound semiconductor, used to form the first barrier layer and the second barrier layer, is either a ternary compound semiconductor or a quaternary compound semiconductor;
wherein composition of a group III element or a group V element included in the first barrier layer is gradually changed along the direction from the center nanorod to the quantum well layer, so that a bandgap gradually becomes smaller along the direction from the center nanorod to the quantum well layer, while a composition of a group III element or a group V element included in the second barrier layer is gradually changed along the direction from the capping layer to the quantum well layer, so that a bandgap gradually becomes smaller along the direction from the capping layer to the quantum well layer.

[4] The light emitting element according to one of [1] to [3], wherein a percentage of an area of the side surfaces covered by the second electrode, relative to the total area of the core-multishell nanowires, is in a range of 10 to 100%.

[5] The light emitting element according to one of [1] to [4], wherein the core-multishell nanowires are arranged in a proportion of one billion or more lines per every 1 $cm^2$ of the surface of the group IV semiconductor substrate.

[6] The light emitting element according to one of [1] to [5], wherein spaces between the core-multishell nanowires covered by the second electrode are filled with an insulator, a semi-insulating semiconductor, or metal.

[7] The light emitting element according to one of [1] to [5], wherein spaces between the core-multishell nanowires covered by the second electrode are filled with a semi-insulating semiconductor or metal.

[8] The light emitting element according to one of [1] to [7],
wherein a refractive index of the III-V compound semiconductors, used to form the first barrier layer and the second barrier layer, is smaller than that of the III-V compound semiconductor used to form the quantum well layer;
wherein the insulating film includes a transparent insulating film;
wherein, of two end faces of each of the core-multishell nanowires, an end face that does not contact the insulating film is either exposed externally to the atmosphere or is covered with the transparent insulating film;
wherein, of two end faces of the quantum well layer, an end face that contacts the insulating film provides an interface with the transparent insulating film that is included in the insulating film; and
wherein, of the two end faces of the quantum well layer, an end face that does not contact the insulating film is either exposed externally to the atmosphere, or forms an interface with the transparent insulating film that covers the end face of the core-multishell nanowire.

[9] The light emitting element according to one of [1] to [8],
wherein the insulating film is divided into two or more regions, and openings are respectively formed in the two or more regions of the insulating film;
wherein a center-to-center distance or a size of openings differs, depending on the two or more regions; and
wherein compositions of the core-multishell nanowires differ in accordance with the two or more regions.

Secondly, the present invention relates to a light emitting element fabrication method described below.

[10] A fabrication method, for a light emitting element that includes a group IV semiconductor substrate and one core-multishell nanowire, or two or more core-multishell nanowires, formed using a III-V compound semiconductor, comprising the steps of:
preparing a substrate such that an insulating film having either one opening or two or more openings is deposited on a group IV semiconductor substrate having a (111) surface so as to cover the (111) surface;
performing a low-temperature heat treatment for the substrate, and performing (111)1×1 reconstruction for the (111) surface;
supplying a group III material or a group V material to the substrate under a low-temperature condition, and performing surface reconstruction for the (111) surface to provide a (111)A surface or a (111)B surface;
permitting a center nanorod, formed of a III-V compound semiconductor of a first conductivity type, to grow through the opening from the (111) surface of the group IV semiconductor substrate;

depositing, on side surfaces of the center nanorod, a first barrier layer, formed of a III-V compound semiconductor of the first conductivity type that has a bandgap larger than that of the III-V compound semiconductor used to form the center nano rod;

depositing, on the first barrier layer, a quantum well layer, formed of a III-V compound semiconductor that has a bandgap smaller than that of the III-V compound semiconductor used to form the first barrier layer;

depositing a second barrier layer on the quantum well layer, using a III-V compound semiconductor of a second conductivity type, which differs from the first conductivity type, that has the same composition as the III-V compound semiconductor used to form the first barrier layer;

depositing, on the second barrier layer, a capping layer, formed of a III-V compound semiconductor of the second conductivity type; and forming a first electrode on the group IV semiconductor substrate, and forming a second electrode on the capping layer.

[11] The fabrication method according to [10], further comprising, before the step of performing low-temperature heat treatment for the substrate:

a step of performing high-temperature heat treatment for the substrate to remove a natural oxide film from a surface of the group IV semiconductor substrate.

[12] The fabrication method according to [10] or [11], further comprising a step of alternately supplying the group V material and the group III material to the (111)A surface or the (111)B surface that is obtained after performing (111)1×1 reconstruction, and forming a thin III-V compound semiconductor film.

[13] The fabrication method according to any of [10] to [12], wherein the step of performing (111)1×1 reconstruction for the (111) surface and the step of performing surface reconstruction for the (111) surface to obtain the (111)A surface or the (111) surface are performed either in the named order, or simultaneously.

[14] The fabrication method according to any of [10] to [13], wherein the group III material is a gas containing boron, aluminum, gallium, indium, or titanium.

[15] The fabrication method according to any of [10] to [14], wherein the group V material is a gas containing nitrogen, phosphorus, arsenic, antimony, or bismuth.

[16] The fabrication method according to any of [10] to [15], wherein the insulating film that covers the (111) surface is a thermal oxide film deposited on the surface of the group IV semiconductor substrate.

[17] The fabrication method according to any of [10] to [16], further comprising the step of filling an insulator, a semi-insulating semiconductor, or metal into spaces between the core-multishell nanowires.

[18] The fabrication method according to any of [10] to [16], further comprising a step of using a semi-insulating semiconductor or metal to fill spaces between the core-multishell nanowires.

[19] The fabrication method according to any of [10] to [18], wherein in the step of preparing the substrate, the insulating film is divided into two or more regions, and openings are respectively formed in the two or more regions of the insulating film; and wherein either a center-to-center distance or a size for the openings differs, depending on two or more regions.

Advantageous Effects of Invention

According to the present invention, a light emitting element that performs light emission with low power consumption and at high luminescence can be provided. When the light emitting element of this invention is employed, for example, for an image display device, the energy required and an environmental load can be reduced.

DESCRIPTION OF EMBODIMENTS

Figure 1:
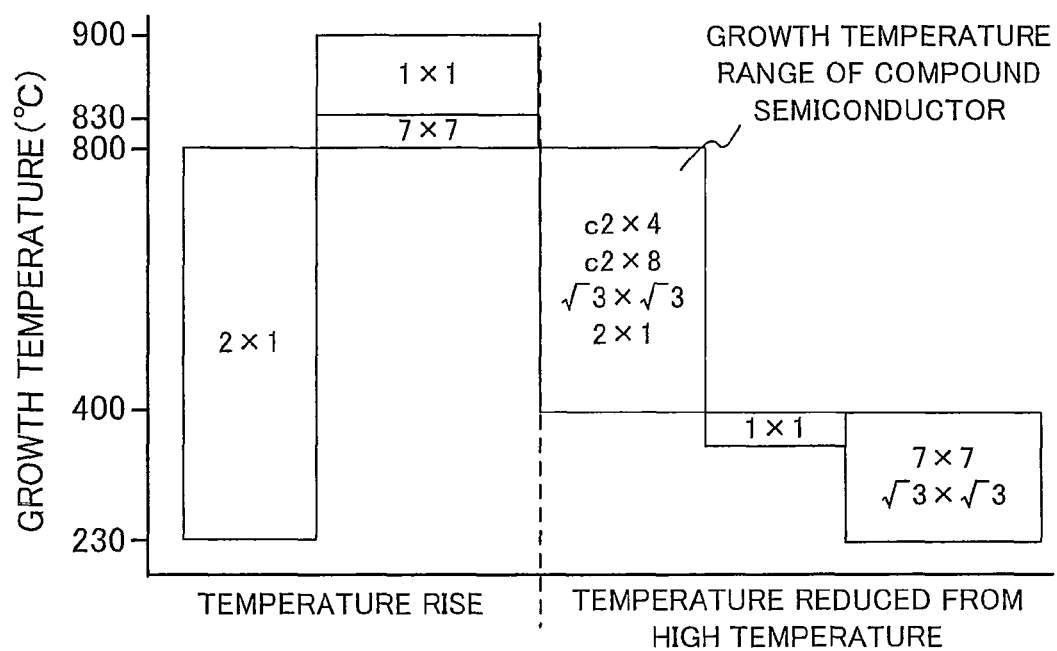
FIG. 1 is a diagram for classification of a silicon surface reconstruction (a phenomenon during which the periodicity of the arrangement of surface atoms is changed) that occurs when the substrate temperature rises to a high temperature and then the temperature of the substrate is lowered from the high temperature.

1. Light Emitting Element of the Present Invention

A light emitting element of the present invention includes a group IV semiconductor substrate, an insulating film, core-multishell nanowires formed of a III-V compound semiconductor, and a first electrode and a second electrode. As will be described later, the light emitting element of this invention is characterized in that 1) the nanowires are arranged on a (111) surface of the group IV semiconductor substrate, 2) the structure for the nanowire is a core-multishell structure, and 3) the side surfaces of the nanowires are covered with a metal electrode (a second electrode).

The group IV semiconductor substrate is a substrate having the (111) surface, formed of a group IV semiconductor, such as silicon or gallium. The group IV semiconductor substrate is doped with a first conductivity type (n-type or p-type). An example group IV semiconductor substrates is an n-type silicon (111) substrate or a p-type silicon (111) substrate.

The insulating film covers the (111) surface of the group IV semiconductor substrate, and has either one opening or two or more openings. When a center nanorod (that will be described later) grows on the (111) surface of the group IV semiconductor substrate, the insulating film serves as a mask pattern. No particular limitation is imposed on the material of the insulating film, so long as the growth of the center nanorod can be interrupted with this film, and the material is an insulator. Example materials for the insulating film include silicon oxide ($SiO_2$), silicon nitride (SiN), and aluminum oxide ($Al_2O_3$). The insulating film may be a single layer, or may be formed of two or more layers. No particular limitation is imposed on the thickness of the insulating film, so long as the insulating characteristics can be exhibited. The thickness of the insulating film is, for example, 20 nm.

As described above, either one opening or two or more openings are formed in the insulating film. The openings are extended to the (111) surface of the group IV semiconductor substrate, and the (111) surface of the group IV semiconductor substrate is exposed inside the openings. For fabrication of the light emitting element of the present invention, the openings are employed to determine the location of the growth of the center nanorod and the thickness and the shape of the center nanorod. No particular limitation is imposed on the shape of the opening, and an arbitrary shape can be determined. An example shape for the opening is a triangle, a quadrilateral, a hexagon, or a circle. An appropriate diameter (width) of the opening is about 2 to 500 nm. In a case wherein the number of openings is two or more, an appropriate center-to-center distance of the openings is about several tens of nm to several μm.

The core-multishell nanowire is a structure having a diameter of 40 to 520 nm and a length of 100 nm to 100 μm, and is formed of a III-V compound semiconductor. The core-multishell nanowire is arranged on the insulating film (the (111) surface of the group IV semiconductor substrate that is exposed inside the opening), so that the longitudinal axis of the core-multishell nanowire is substantially perpendicular to the surface of the insulating film (the (111) surface of the group IV semiconductor substrate). In the present specification, of the two end faces of the core-multishell nanowire (the two faces that intersect the center line in the longitudinal direction), the end face close to the substrate (or the insulating film) is called "a lower end face," and the end face on the opposite side is called "an upper end face." When the core-multishell nanowires are formed on the (111) surface of the group IV semiconductor substrate, which will be described later, the core-multishell nanowires can be arranged perpendicular to the (111) surface, at a high density. One billion core-multishell nanowires, or more, can be arranged in each 1 $cm^2$ of the surface of the group IV semiconductor substrate.

As previously described, one of the characteristics of the light emitting element of the present invention is that the nanowires employ the core-multishell structure. That is, each of the core-multishell nanowires includes: a center nanorod; a first barrier layer that covers the side surfaces of the center nanorod (the surfaces that intersect the center line in the longitudinal direction); a quantum well layer that covers the first barrier layer; a second barrier layer that covers the quantum well layer; and a capping layer that covers the second barrier layer. All of the cover layers (the first barrier layer, the quantum well layer, the second barrier layer, and the capping layer) cover the side surfaces of the center nanorod, but do not cover the two end faces of the center nanorod. The center nanorod and all of the cover layers, which cover the side surfaces of the center nanorod, form the faces at the two end portions of the core-multishell nanowire. No particular limitation is imposed on the overall thickness of the cover layer, and about 20 to 300 nm is appropriate.

The center nanorod and the first barrier layer are formed of a III-V compound semiconductor of the first conductivity type (n-type or p-type), which is the same type as for the group IV semiconductor substrate. The second barrier layer and the capping layer are formed of a III-V compound semiconductor of a second conductivity (p-type or n-type) that differs from the first conductivity type. Therefore, in the core-multishell nanowire, a p-n junction (or a p-i-n junction) is established in the radial direction, and a p-n junction (a p-i-n junction) is established on the entire side surfaces of the center nanorod. With this structure, the area of the p-n junction (luminescence area) can be more greatly increased as compared with that for a conventional light emitting element (4 to 10 times the area provided by a light emitting element having a planar p-n junction), and a higher luminescence can be obtained. The center nanorod and the individual cover layers will now be described in more detail.

The center nanorod is formed of a III-V compound semiconductor of the first conductivity type, which is the same type as is employed for the group IV semiconductor substrate, and is extended upward from the (111) surface of the group IV semiconductor substrate through the opening in the insulating film. The III-V compound semiconductor of the center nanorod can be a binary compound semiconductor, a ternary compound semiconductor, a quaternary compound semiconductor, or a semiconductor composed of more elements. Example binary compound semiconductors include InAs, InP, GaAs, GaN, InSb, GaSb, and AlSb. Example ternary compound semiconductors are AlGaAs, InGaAs, InGaN, AlGaN, GaNAs, InAsSb, GaAsSb, InGaSb, and AlInSb. Example quaternary compound semiconductors include InGaAlN, AlInGaP, InGaAsP, GaInAsN, InGaAlSb, InGaAsSb, and AlInGaPSb. Furthermore, the appropriate width of the center nanorod is about 2 to 500 nm, and the appropriate length of the center nanorod is about 100 nm to 100 μm.

The first barrier layer covers the side surfaces of the center nanorod. The first barrier layer contacts the insulating film, but does not contact the group IV semiconductor substrate. The first barrier layer is formed of a III-V compound semiconductor of the first conductivity type that has a bandgap larger than that of the III-V compound semiconductor used to form the center nanorod. The first barrier layer serves as a barrier layer for a quantum well structure. Therefore, the III-V compound semiconductor used to form the first barrier layer must have a larger bandgap than the III-V compound semiconductor used to form the quantum well layer. However, when band discontinuities have occurred at the interface between the III-V compound semiconductor used to form the first barrier and the III-V compound semiconductor used to form the quantum well layer, the resistance of the light emitting element would be increased. Therefore, preferably, the bandgap of the III-V compound semiconductor used to form the first barrier is gradually reduced along the direction taken from the center nanorod to the quantum well layer, and, in the vicinity of the interface with the quantum layer, becomes equal to the bandgap of the III-V compound semiconductor used to form the quantum well layer. As a result, the resistance of the light emitting element can be lowered.

No particular limitation is imposed on the III-V compound semiconductor that serves as the constituent of the first barrier layer, so long as the bandgap is larger than the bandgaps of the III-V compound semiconductor used to form the center nanorod and the III-V compound semiconductor used to form the quantum well layer, and there may be employed a binary compound semiconductor, a ternary compound semiconductor, a quaternary compound semiconductor, or a semiconductor composed of more elements. In a case wherein, as described above, the bandgap of the III-V compound semiconductor used to form the first barrier layer is gradually reduced from the center nanorod side to the quantum well layer side, a ternary compound semiconductor or a quaternary compound semiconductor is preferable as a III-V compound semiconductor to form the first barrier layer. This is because when the composition of group III elements or group V elements for the ternary compound semiconductor or the quaternary compound semiconductor is gradually changed from the center nanorod side to the quantum well layer side, the bandgap of the III-V compound semiconductor used to form the first barrier layer can be gradually reduced from the center nanorod to the quantum well layer side. For example, in a case where the first barrier layer is formed of AlGaAs, the ratio of Ga (group III element) is gradually increased from the center nanorod side to the quantum well layer side (the ratio of Al (group III element) is gradually reduced), so that the bandgap of AlGaAs can be gradually reduced from the center nanorod side to the quantum well layer side. Further, in a case where the first barrier layer is formed of InAsP, the ratio of As (group V element) is gradually increased from the center nanorod side to the quantum well layer side (the ratio of P (group V element) is gradually reduced), so that the bandgap of InAsP can be gradually reduced from the center nanorod side to the quantum well layer side. No particular limitation is imposed on the thickness of the first barrier layer, so long as the first barrier layer is thicker than a depletion layer formed at the p-n junction interface, and, as an example, 5 nm or greater is appropriate.

The quantum well layer covers the first barrier layer. The quantum well layer contacts the insulating layer, and does not contact the group IV semiconductor substrate. The quantum well layer is formed of a III-V compound semiconductor that has a bandgap smaller than that of the III-V compound semiconductor used to form the first barrier layer and the III-V compound semiconductor used to form the second barrier layer. The III-V compound semiconductor used to form the quantum well layer may be doped with the first conductivity type or the second conductivity type, or may be an intrinsic semiconductor. The quantum well layer serves as a quantum well layer having a quantum well structure. An appropriate thickness for the quantum well layer is about 1 to 50 nm.

The second barrier layer covers the quantum well layer. The second barrier layer covers the insulating layer, and does not contact the group IV semiconductor substrate. The second barrier layer is a III-V compound semiconductor having the same composition as the III-V compound semiconductor that serves as a constituent of the first barrier layer. The III-V compound semiconductor used for the second barrier layer is doped with the second conductivity type. The second barrier layer, as well as the first barrier layer, serves as a barrier layer for the quantum well structure. The III-V compound semiconductor for the second barrier layer has a bandgap larger than that of the III-V compound semiconductor for the quantum well layer, as well as the III-V compound semiconductor for the first barrier layer. Likewise for the first barrier layer, when band discontinuities have occurred at the interface between the III-V compound semiconductor for the second barrier layer and the III-V compound semiconductor for the quantum well layer, the resistance of the light emitting element will be increased. Therefore, preferably, the bandgap of the III-V compound semiconductor for the second barrier layer is gradually reduced from the capping layer side to the quantum well layer side, and in the vicinity of the interface with the quantum well layer, is equal to the bandgap of the III-V compound semiconductor for the quantum well layer. As a result, the resistance of the light emitting element can be lowered. Further, when the composition of group III elements or group V elements of the ternary compound semiconductor or the quaternary compound semiconductor are gradually changed from the capping layer side to the quantum well layer side in the same manner as for the first barrier layer, the bandgap of the III-V compound semiconductor used for the second barrier layer can be gradually reduced from the capping layer side to the quantum well layer side. An appropriate film thickness for the barrier layer is, for example, about 5 to 100 nm.

The capping layer covers the second barrier layer. The capping layer contacts the insulating layer, and does not contact the group IV semiconductor substrate. The capping layer includes a layer formed of a III-V compound semiconductor of the second conductivity type, which is the same conductivity type of the second barrier layer, so that a connection to the second electrode by ohmic contact can be easily established. The capping layer is, for example, either a layer formed of a III-V compound semiconductor of the second conductivity, or a lamination of a layer formed of a III-V compound semiconductor of the second conductivity type and a III-V compound semiconductor of the second conductivity having a high impurity density. An appropriate film thickness for the capping layer is about 5 to 10 nm.

The first electrode is connected to the group IV semiconductor substrate without contacting the core-multishell nanowires. For example, the first electrode is arranged on the reverse surface of the group IV semiconductor substrate. No particular limitation is imposed on the material of the first electrode, so long as metal that can be connected by ohmic contact to the group IV semiconductor substrate is employed. For example, in a case where the substrate is formed of an n-type group IV semiconductor, the first electrode may be a Ti/Au multilayer film, a Ti/Al multilayer film, etc. Further, in a case where the substrate is formed of a p-type group IV semiconductor, the first electrode may be a Cr/Au multilayer film, an AuZn alloy film, etc. No particular limitation is imposed on the film thickness of the first electrode, and a thickness of about 1 to 1000 nm is appropriate.

The second electrode covers the side surfaces of the core-multishell nanowire, and is connected to the capping layer of the core-multishell nanowire. Since the second electrode covers the side surfaces of the core-multishell nanowire, a current can be efficiently injected into the p-n junction formed at the side surfaces of the center nanorod. As a result, low power consumption can be achieved. Further, since the second electrode reflects light at the side surfaces of the core-multishell nanowire, light generated in the core-multishell nanowire can be confined inside the core-multishell nanowire. Light confined in the core-multishell nanowire is efficiently emitted externally from the upper end face of the core-multishell nanowire. Therefore, high luminescence can be obtained.

From the viewpoint of establishing both low power consumption and high luminescence, the ratio of the coverage area of the second electrode to the total area of the side surfaces of the core-multishell nanowire is preferably within a range of 10 to 100%, more preferably within a range of 20 to 100%, and most preferably within a range of 50 to 100%. Also, preferably, of the side surfaces of the core-multishell nanowire, the portions that are not covered with the second electrode are covered with a dielectric film. For example, in a case where 80% of the side surfaces close to the upper end of the core-multishell nanowire is covered with the second electrode, the 20% close to the lower end (the substrate side) is preferably covered with a dielectric film. With this arrangement, a leakage current can be more appropriately prevented from flowing between the second electrode and the group IV semiconductor substrate. Example dielectric films include an $SiO_2$ film and an $Al_2O_3$ film.

No particular limitation is imposed on the material of the second electrode, so long as metal that can be connected by ohmic contact to the capping layer is employed. For example, in a case where the capping layer is formed of an n-type III-V compound semiconductor, the second electrode may be a Ti/Au multilayer film, a Ti/Al multilayer film, etc. Further, in a case where the capping layer is formed of a p-type III-V compound semiconductor, the second electrode may be a Cr/Au multilayer film, an AuZn alloy film, etc. No particular limitation is imposed on the film thickness of the second electrode, and a thickness of about 1 to 1000 nm is appropriate.

Preferably, spaces between the core-multishell nanowires that are covered with the second electrode are filled with an insulator, a semi-insulating semiconductor, or a metal. When the spaces between the core-multishell nanowires are filled with these materials, the strength of the entire light emitting element can be increased. Furthermore, when spaces between the core-multishell nanowires are filled with an insulator or a semi-insulating semiconductor, the core-multishell nanowires can be completely isolated, electrically, and the reliability of the light emitting element can be improved. An example insulator includes an insulating resin, such as a BCB resin. No particular limitation is imposed on the type of these materials, so long as a solid material is employed, and a transparent material is preferable, from the viewpoint of the efficient emission of light generated in the core-multishell nanowires.

Furthermore, from the viewpoint of suppressing deterioration of the light emitting element due to Joule heating, the spaces between the core-multishell nanowires that are covered with the second electrode are preferably filled with a semi-insulating semiconductor or metal, which has higher thermal conductivity than an insulating resin. For example, the thermal conductivity of the BCB resin that is an insulating resin is 0.29 W/m·K. In contrast, the thermal conductivity of semi-insulating semiconductor Si is 163.3 W/m·K, and the thermal conductivity of GaAs is 55 W/m·K. No particular limitation is imposed on the type of semi-insulating semiconductor or the type of metal, and a material having a high thermal conductivity is preferable. Example semi-insulating semiconductors having high thermal conductivity include not only Si and Ge, but also the above-described III-V compound semiconductor. Example metals having high thermal conductivity include silver and copper. When a semi-insulating semiconductor or metal having high thermal conductivity is employed to fill the spaces between the core-multishell nanowires, Joule heat generated in the core-multishell nanowires can be efficiently discharged outside, and the degrading of the emission characteristics and the deterioration of the light emitting element, which are caused by Joule heating, can be suppressed. Further, since a deterioration of the light emitting element due to Joule heating can be suppressed, high-current injection can be performed, and the output of the light emitting element can be further increased.

For the light emitting element of the present invention, 1) nanowires are arranged on the (111) surface of the group IV semiconductor substrate, 2) the structure for the nanowires is a core-multishell structure, and 3) the side surfaces of the nanowires are covered with a metal electrode (the second electrode).

1) For the light emitting element of the present invention, since the nanowires are arranged on the (111) surface of the group IV semiconductor substrate, the orientation of the nanowires is substantially perpendicular to the surface of the substrate. Therefore, for the light emitting element of the present invention, the nanowires serving as light emitting entities can be arranged at a high density (one billion wires or more/$cm^2$), and the overall luminescence of the light emitting element can be increased.

2) For the light emitting element of the present invention, since the core-multishell structure is adopted for the nanowires, a large area is obtained for the p-n junction. Therefore, for the light emitting element of the present invention, the emission area allocated per unit area of the substrate can be increased, and the overall luminescence of the light emitting element can be improved.

3) For the light emitting element of the present invention, since the side surfaces of the nanowires are covered with the metal electrode (the second electrode), a current can be efficiently injected to the entire surface at the p-n junction. Therefore, low power consumption can be achieved by the light emitting element of the present invention. Furthermore, according to the present invention, since the side surfaces of the nanowires of the light emitting element are covered with the metal electrode (the second electrode), light produced in the nanowires can be confined inside the nanowires. Thus, for the light emitting element of the present invention, light generated in the nanowires can be efficiently emitted from the upper end faces of the nanowires, and the overall luminescence of the light emitting element can be improved.

As described above, according to the light emitting element of the present invention, both increase in luminescence and reduction of power consumption, which cannot be achieved by the conventional semiconductor light emitting element, can be established.

The light emitting element of the present invention can also be employed as a laser oscillator (see example 1). In order to operate the light emitting element of this invention as a laser oscillator, light must be repetitively reflected inside the quantum well layer in the longitudinal direction of the nanowires. To perform this process, first, an appropriate III-V compound semiconductor to be used to form each layer should be selected, so that the refractive indexes of the first barrier layer and the second barrier layer is preferably smaller than the refractive index of the quantum well layer. As a result, light generated in the quantum well layer can be confined within the quantum well layer.

Further, an appropriate III-V compound semiconductor to be used to form the quantum well layer and an appropriate insulating film to cover the substrate should be selected, so that the two end faces (the upper end face and the lower end face) of the quantum well layer can be employed as laser cavity mirrors. Specifically, the interface between the lower end face of the quantum well layer and the insulating film that covers the substrate is preferably an interface of "a III-V compound semiconductor/a totally reflecting insulating film." That is, it is appropriate for the outermost layer of the insulating film that contacts the lower end face of the quantum well layer to be a totally reflecting insulating film. Further, the interface that includes the upper end face of the quantum well layer is preferably an interface of "a III-V compound semiconductor/air" or "a III-V compound semiconductor/a partially reflecting insulating film." That is, it is appropriate that the upper end face of the core-multishell nanowire either be directly exposed to the external atmosphere, or be covered with the partially reflecting insulating film. This structure enables light to travel between the upper end face and the lower end face in the quantum well layer, and enables amplified light to be emitted from the upper end face of the core-multishell nanowire. Appropriate materials for use as the totally reflecting insulating film and the partially reflecting insulating film are optically transparent (either transparent or translucent) insulators that have a refractive index smaller than that of the III-V compound semiconductor used to form the second barrier layer. Example materials for the totally reflecting insulating film and the partially reflecting insulating film include $SiO_2$, $SiN$, and $Al_2O_3$.

When the above-described arrangement is employed, light amplification can be performed inside the quantum layer, and the light emitting element of the present invention can be operated as a laser oscillator.

As described above, the light emitting element of the present invention can not only achieve both high luminescence and low power consumption, but can also be employed as a laser oscillator.

An arbitrary fabrication method can be employed for the light emitting element of the present invention, so long as the effects provided by the present invention are not lost. For example, a fabrication method for the present invention, which will be described below, can be employed to fabricate the light emitting element of the present invention.

2. Light Emitting Element Fabrication Method of the Present Invention

A fabrication method for the light emitting element of the present invention includes: 1) a first step of preparing a substrate; 2) a second step of forming core-multishell nanowires; and 3) a third step of forming a first electrode and a second electrode.

1) Preparation of a Substrate

In the first step, there is prepared a substrate that includes a group IV semiconductor substrate having a (111) surface and an insulating film for covering the (111) surface. Here, No particular limitation is imposed on the type of group IV semiconductor substrate employed, so long as the type employed has a (111) surface, and is, for example, an n-type silicon (111) substrate or a p-type silicon (111) substrate.

The (111) surface of the group IV semiconductor substrate is covered with the insulating film, in which an opening, or openings, are formed. No particular limitation is imposed on the material for the insulating film that covers the (111) surface, so long as the growth of the center nanorod can be interrupted by the film and an insulator is employed. Example materials to be used for the insulating film include $SiO_2$, $SiN$, and $Al_2O_3$. No particular limitation is imposed on the thickness of the insulating film used to cover the (111) surface, and a thickness of about 20 nm, for example, is appropriate. A silicon oxide film can be formed by performing, for example, thermal oxidation of the silicon substrate. Of course, the insulating film may be formed by performing an ordinary thin-film deposition procedure, such as sputtering.

One opening, or two or more openings, are formed in the insulating film that covers the (111) surface of the group IV semiconductor substrate. To form the opening, or openings, a submicron patterning technology, such as e-beam lithography, photolithography, or nanoimprint lithography, can be employed. The (111) surface of the group IV semiconductor substrate is externally exposed through the opening or openings. No particular limitation is imposed on the shape used for an opening, and an arbitrary shape can be selected. Example shapes to use for an opening include a triangle, a quadrilateral, a hexagon, and a circle. An appropriate diameter for an opening is about 2 to 500 nm. When the diameter of an opening is too large, multiple dislocations or defects may appear at the junction interface of the (111) surface of the group IV semiconductor substrate and the center nanorod. In a case where two or more openings are formed, it is appropriate that the center-to-center distance of the openings be about several tens of nm to several μm.

Generally, a natural oxide film is deposited on the surface of a group IV semiconductor substrate. Preferably, this natural oxide film is removed; otherwise the growth of the center nanorod will be interrupted. Therefore, after openings have been formed in the insulating film that covers the (111) surface of the group IV semiconductor substrate, it is advisable that a high-temperature heat treatment be performed for the group IV semiconductor substrate to remove the natural oxide film deposited on the surface. The conditions under which the high-temperature heat treatment can be performed are, for example, a temperature of about 900° C. in an atmosphere of an inert gas, such as hydrogen gas, nitrogen gas, or argon gas. When the high-temperature heat treatment is performed in this manner, the natural oxide film that covers the (111) surface and is exposed through the openings is removed, and oxygen atoms are removed from the crystal structure at the interface of the group IV semiconductor and the natural oxide film. In those places where oxygen atoms have been removed, either group III atoms or group V atoms are adsorbed and replace the oxygen atoms (this will be described later).

Figure 2A:
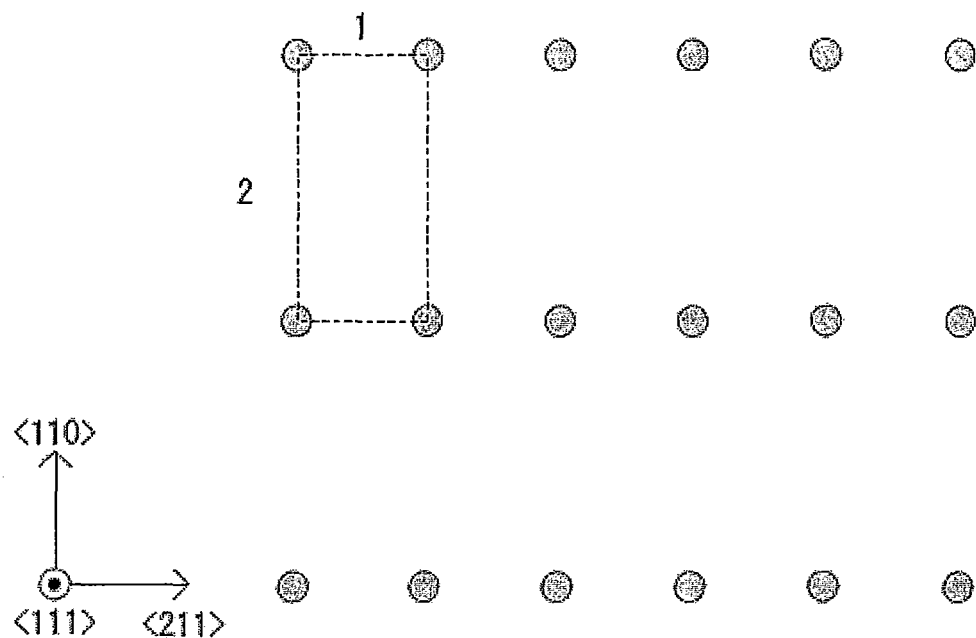
FIG. 2A is a schematic diagram showing a (111)2×1 surface.
Figure 2B:
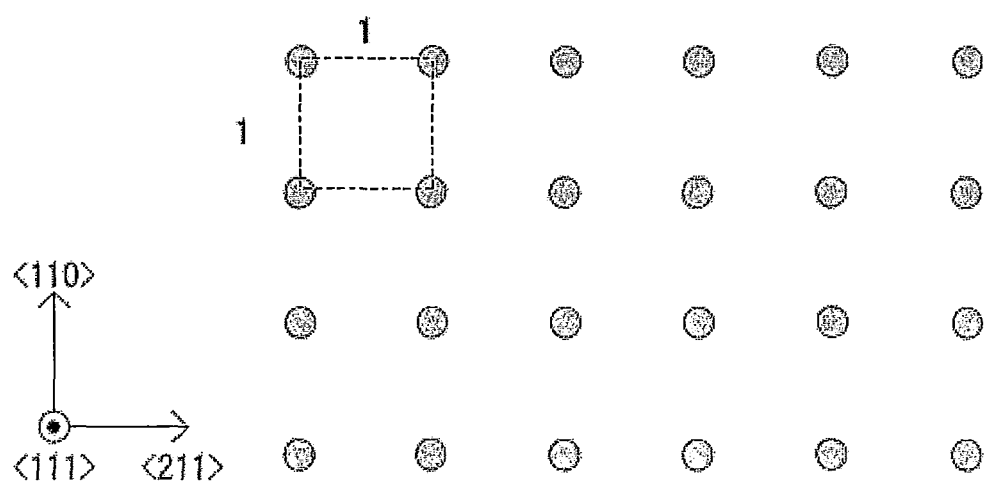
FIG. 2B is a schematic diagram showing a (111)1×1 surface.

After the high-temperature heat treatment, the resultant (111) surface has a 1×1 structure. When the temperature of the substrate is reduced in this state, however, an irregular atomic arrangement is formed on the surface of the substrate, as indicated by classification in FIG. 1 (a temperature range for the growth of a compound semiconductor). However, when the temperature is more continuously reduced and reaches about 400° C., the surface of the substrate is recovered to 1×1 structure. Therefore, according to the fabrication method of this invention, after the high-temperature heat treatment has been performed, the temperature of the substrate is temporarily reduced to a low level of the temperature (about 400° C.). Here, the "low level" of the temperature is a temperature lower than a level required for the growth of the compound semiconductor nanowire. When the temperature of the substrate is lowered in this manner, reconstruction of the (111)2×1 surface of the group IV semiconductor substrate is performed to provide the (111)1×1 surface. A "(111)2×1 surface" has a surface structure where, as shown in FIG. 2A, the minimum spacing unit for an arrangement consisting of atoms is two atoms by one atom. The "(111)1×1 surface" has a surface structure where, as shown in FIG. 2B, the minimum spacing unit for an arrangement consisting of atoms is one atom by one atom.

As will be described later, reconstruction is performed for the (111)1×1 surface of the group IV semiconductor substrate by using group III elements or group V elements, and the (111)A surface or the (111)B surface is provided. Here, the "(111)A surface" is the surface on which the group III elements are arranged. The "(111)B surface" is the surface on which the group V elements are arranged.

When the (111)1×1 surface of the group IV semiconductor substrate has been changed to the (111)A surface or the (111)B surface, the III-V compound semiconductor can easily grow from the pertinent surface. The (111)A surface or the (111)B surface of the III-V compound semiconductor is a (111)2×2 surface; i.e., has a structure employing an arrangement of two atoms×two atoms as the minimum spacing unit. Therefore, when the group III elements or the group V elements are arranged on the surface of the group IV semiconductor substrate, at a spacing smaller than the minimum spacing unit of two atoms by two atoms, the III-V compound semiconductor tends to grow on the surface of the group IV semiconductor substrate.

Whereas there is a report that the stable structure for the (111) surface, which is easily obtained by high-temperature heat treatment of the silicon substrate, is the (111)7×7 surface (Surf. Sci. Vol. 164, (1985), p. 367-392), when the (111)7×7 surface is changed to the (111)A surface or the (111)B surface through reconstruction, the minimum spacing unit in the arrangement periodicity is seven atoms by seven atoms. This minimum spacing unit is greater than the minimum spacing unit for the arrangement periodicity in the crystal structure of the III-V compound semiconductor. As a result, the III-V compound semiconductor does not easily grow on this surface.

As for the reconstruction of the (111)2×1 surface of the group IV semiconductor substrate to obtain the (111)1×1 surface, the low-temperature heat treatment should be performed at an appropriate temperature of about 350 to 450° C. (e.g., about 400° C.). Preferably, the low-temperature heat treatment is performed in an atmosphere of inert gas, such as hydrogen gas, nitrogen gas, argon gas, or helium gas.

The reconstruction performed for the (111)2×1 surface of the group IV semiconductor substrate to provide the (111) 1×1 surface is performed through the low-temperature heat treatment, and in order to perform the reconstruction for providing the (111)A surface or the (111)B surface, either a group III material or a group V material is supplied to the surface of the group IV semiconductor substrate. Preferably, the group III material is a gas containing boron, aluminum, gallium, indium, or titanium (or an organometallic compound). An example group III material is an organometallic compound containing an alkyl group, such as trimethylgallium or trimethylindium. Further, the group V material is preferably a gas containing nitrogen, phosphorus, arsenic, antimony, or bismuth (or an organometallic compound). An example group V material is arsenic hydride (arsine $AsH_3$). The group III material or the group V material is preferably supplied at 400 to 500° C.

The process for performing reconstruction to change the surface of the group IV semiconductor substrate to the (111)A surface or the (111)B surface may be performed after the process for performing the reconstruction to change the surface of the IV semiconductor substrate to the (111)1×1 surface, or at the same time as the reconstruction process for forming the (111)1×1 surface. Specifically, while the low-temperature heat treatment is being performed at about 400° C. to change the (111) surface of the group IV semiconductor substrate to the (111)1×1 surface, the group III material or the group V material may be supplied to change the surface to the (111)A surface or the (111)B surface.

As described above, when the group IV semiconductor substrate is undergoing the heat treatment at a high temperature (e.g., 900° C.) to remove a natural oxide film, oxygen atoms are removed from the (111) surface. When the (111) 1×1 surface is formed in the state wherein the oxygen atoms have been removed, the portion where combining of the group IV elements is disconnected is formed. As shown in FIG. 1, the resultant (111) surface, following the high-temperature heat treatment, has a 1×1 structure, and when the temperature is continuously reduced in this state, an arrangement of atoms is formed on the surface in various irregular periodicities. However, when the temperature is more continuously reduced, down to about 400° C., the 1×1 structure of the (111) surface is recovered. Thermodynamically, the 1×1 structure thus recovered is unstable, and when the group III element or the group V element is supplied in this state, the group III elements or the group V elements are absorbed on the surface and replace the group IV atoms (e.g., silicon atoms) on the outermost surface, and the (111)A surface or the (111)B surface is created. Therefore, formation of the (111)A surface or the (111)B surface is comparatively easy.

2) Fabrication of Core-Multishell Nanowires

At the second step, core-multishell nanowires are formed on the insulating film. More specifically, the center nanorods are permitted to grow from the (111) surface of the group IV semiconductor substrate that is exposed through the openings, and a plurality of cover layers are formed on the side surfaces of each of the center nanorods. At this time, preferably, before the growth of the center nanorods is permitted, a thin III-V compound semiconductor film is deposited on the (111) surface of the group IV semiconductor substrate by using the alternate material supply modulation method.

[Alternate Material Supply Modulation Method]

A source gas containing a group III element and a source gas containing a group V element are alternately supplied to the group IV semiconductor substrate (hereinafter, referred to as an "alternate material supply modulation method"), and a thin III-V compound semiconductor film is formed on the (111)A surface or the (111)B surface that is exposed through the openings in the insulating film. This thin film deposition by the alternate material supply modulation method is preferably performed at a temperature lower than the temperature required for the growth of the center nanorod. For example, thin film deposition by the alternate material supply modulation method can be performed either at about 400° C., or by raising the temperature, beginning at 400° C.

Specifically, in a case wherein the (111)A surface is prepared for the group IV semiconductor substrate, first, a source gas containing a group III element is supplied, and thereafter a source gas containing a group V element is supplied. Further, alternate supply of the source gas containing the group III element and the source gas containing the group V element is repeated. In a case wherein the (111)B surface is formed on the group IV semiconductor substrate, first, a source gas containing a group V element is supplied, and thereafter, a source gas containing a group III element is supplied. Then, the alternate supply of the source gas containing the group V element and the source gas containing the group III element is repeated.

About several seconds is appropriate as a period of time for supplying the source gas containing the group V element and for supplying the source gas containing the group III element. Furthermore, an interval of several seconds is preferably provided between the supply of the source gas containing the group V element and the supply of the source gas containing the group III element. Alternate supply of the source gas containing the group V element and the source gas containing the group III element should be performed until a desired thickness is obtained for the thin III-V compound semiconductor film. A thin III-V compound semiconductor film is deposited by repetitively supplying the gases several times.

When the alternate material supply modulation method is employed, a compensation effect is also provided such that, even when a portion is left on the surface of the IV semiconductor substrate after the (111)1×1 surface has been changed to a (111)A or a (111)B surface, there is an opportunity for performing reconstruction of this portion to form a (111)A or a (111)B surface. This is because the group IV element, and the group III element or the group V element are combined using the alternate material supply modulation method.

Thereafter, the temperature of the substrate is raised for the growth of the semiconductor nanowires, while the thin III-V compound semiconductor film, deposited by the alternate material supply modulation method, prevents thermal dissociation of the group III element and the group IV element that are adsorbed on the substrate.

[Formation of the Center Nanorod]

After the thin III-V compound semiconductor film has been formed, the center nanorod formed of the III-V compound semiconductor is permitted to grow from the surface of the group IV semiconductor substrate through the opening in the insulating film. The growth of the center nanorod is performed, for example, by metal-organic vapor phase epitaxy (hereinafter also referred to as the "MOVPE method"), or molecular beam epitaxy (hereinafter also referred to as the "MBE method"). Preferably, the MOVPE method is employed for the growth of the center nanorod. It should be noted that, in an area other than the opening, the growth of the center nanorod is interrupted by the insulating film.

Formation of the semiconductor nanowires using the MOVPE method can be performed by an ordinary MOVPE apparatus. That is, the only requirement is to provide a source gas containing a group III element and a source gas containing a group V element at a predetermined temperature and under a low pressure condition. For example, for forming an InAs nanowire, a gas containing trimethylindium and a gas containing arsenic hydride should be provided at about 540° C. Furthermore, for forming a GaAs nanowire, a gas containing trimethylgallium and a gas containing arsenic hydride should be provided at about 750° C.

Through the above described processing, the center nanorod of the III-V compound semiconductor can be formed on the (111) surface of the group IV semiconductor substrate, so that the longitudinal axis is perpendicular to the (111) surface. Basically, there are no dislocations and no defects on the junction interface of the thus formed center nanorod and the (111) surface of the group IV semiconductor substrate.

The center nanorod is doped with the first conductivity type (either an n-type or a p-type). When, for example, a gas dopant or an organometallic dopant is supplied during the process for forming the center nanorod by using the MOVPE method, an n-type dopant or a p-type dopant can be doped in the center nanorod. Specifically, when a gas or an organometallic material that contains group IV atoms and the material for the center nanorod are supplied simultaneously by the MOVPE method, an n-type center nanorod can be formed. Likewise, when a gas or an organometallic material that contains group VI atoms and the material for the center nanorod are supplied simultaneously, a p-type center nanorod can be formed. In an n-type doping case, no particular limitations are imposed on the types of gas dopants and the types of organometallic dopants, so long as a dopant contains C, Si, Ge, Sn, O, S, Se, or Te, and in a p-type doping case, no particular limitation is imposed on the dopant type, so long as a dopant contains C, Zn, or Te. As another method, when ions consisting of group IV atoms are implanted to the center nanorod by the ion implantation method, an n-type center nanorod can be formed. Similarly, when ions consisting of group VI atoms are implanted to the center nanorod, a p-type center nanorod can be formed. No particular limitation is imposed on the density of a carrier, and a density of about $1\times10^{16}$ to $5\times10^{20}$ cm$^{-3}$ is appropriate.

[Formation of Cover Layers]

At the second step, cover layers are formed on the side surfaces of the center nanorod. More specifically, a first barrier layer is formed on the side surfaces of the center nanorod, and then a quantum well layer, a second barrier layer, and a capping layer are deposited on the first barrier layer in the named order. The formation of the cover layers is performed, for example, by metal-organic vapor phase epitaxy (hereinafter also referred to as the "MOVPE method"), or molecular beam epitaxy (hereinafter also referred to as the "MBE method"). From the viewpoint of a reduction in the number of steps, the method for forming cover layers is preferably the same as the method for fabricating the center nanorod.

In order to form cover layers on the side surfaces of the center nanorod, the growth of the center nanorod should be promoted in the radial direction, rather than in the longitudinal direction. In order to promote the growth in the radial direction, the temperature of the substrate must be lowered about 50 to 200° C. from the temperature at which the center nanorod was grown. Therefore, the rate of the growth across the side surfaces of the nanorod becomes greater than the growth rate in the longitudinal direction of the nanorod, and transverse growth can be obtained so as to form cover layers on the side surfaces of the center nanorod. The vertical growth is not completely interrupted, and in a case wherein cover layers are formed to cover the upper end face of the center nanorod, it is simply required that mechanical polishing be performed to expose the center nanorod and the end faces of the individual cover layers.

For depositing the first barrier layer, the quantum well layer, the second barrier layer, and the capping layer, the types of source gas to be supplied need only be changed depending on the cover layer deposition processes. For example, when the deposition of cover layers is to be performed to provide a structure of laminations in the order of AlGaAs, GaAs, AlGaAs, and GaAs, beginning on the center nanorod side in the radial direction, trimethylaluminum gas, trimethylgallium gas, and arsenic hydride gas are supplied to permit the growth of AlGaAs at 750° C.; then, trimethylgallium gas and arsenic hydride gas are supplied to permit the growth of GaAs at 700° C.; thereafter, trimethylaluminum gas, trimethylgallium gas, and arsenic hydride gas are supplied to permit the growth of AlGaAs at 750° C.; and following this, trimethylgallium gas and arsenic hydride gas are supplied to permit the growth of GaAs at 750° C. Furthermore, for the first barrier layer and the second barrier layer, the composition of a source gas of a group III element or a group V element can be gradually changed, so that the composition of a group III element or a group V element for a ternary compound semiconductor or a quaternary compound semiconductor will be gradually changed.

The first barrier layer, the second barrier layer, and the capping layer are doped with the first conductivity type (n-type or p-type) or the second conductivity type (p-type or n-type). The quantum well layer either may be doped with the first conductivity type (n-type or p-type) or the second conductivity type (p-type or n-type), or may not be doped. When a gas or an organometallic material that contains group IV atoms and the materials for cover layers are supplied simultaneously by the MOVPE method, n-type cover layers can be formed. Similarly, when a gas or an organometallic material that contains group VI atoms and the materials for the cover layers are supplied simultaneously, p-type cover layers can be formed. In an n-type doping case, no particular limitations are imposed on the types of a gas dopant and of an organometallic dopant, so long as the dopant contains C, Si, Ge, Sn, O, S, Se, or Te, and in a p-type doping case, no particular limitation is imposed on the dopant type, so long as the dopant contains C, Zn, or Te. No particular limitation is imposed on the density of a carrier, and a density of about $1\times10^{16}$ to $5\times10^{20}$ $cm^{-3}$ is appropriate.

3) Formation of the First Electrode and the Second Electrode

In the third step, the first electrode and the second electrode are formed. The first electrode can be formed on the group IV semiconductor substrate so as not to contact the core-multishell nanowire. No particular limitation is imposed on methods for forming the first electrode on the group IV semiconductor substrate. For example, photolithography may be employed, whereby an area other than an electrode formation portion is masked with a resist film, and a metal, such as gold, platinum, titanium, chromium, aluminum, palladium, or molybdenum, is deposited, by vacuum deposition, and the resist film is removed (lift-off). Further, after chromium, titanium, etc., has been deposited, by vacuum deposition, gold may be deposited, by vacuum deposition, to provide a double-layer electrode.

The second electrode can be formed on the side face (capping layer) of the core-multishell nanowire so as not to contact the group IV semiconductor substrate. No particular limitation is imposed on methods for forming the second electrode on the side face of the core-multishell nanowire.

In a case, for example, where the core-multishell nanowire is to be embedded in an insulator or in a semi-insulating semiconductor, 1) the surface of the core-multishell nanowire is covered with a dielectric film having a predetermined thickness, 2) the core-multishell nanowire covered with the dielectric film is embedded in the insulator or in the semi-insulating semiconductor, 3) a part of the insulator or a part of the semi-insulating semiconductor is removed to expose the tip portion of the core-multishell nanowire that is covered with the dielectric film, 4) the dielectric film that covers the core-multishell nanowire is removed to form a gap between the core-multishell nanowire and the insulator or the semi-insulating semiconductor, and 5) metal is deposited in the gap formed in 4), so that the second electrode can be formed (see embodiments 1 and 3).

Further, in a case wherein the core-multishell nanowire is to be embedded in metal, 1) the side faces of the core-multishell nanowire are covered with metal that is used to form an ohmic contact electrode, 2) the core-multishell nanowire that is covered with the metal that is to form the ohmic contact electrode is embedded in metal that is the same as, or is different from, the metal that is used to form the ohmic contact electrode. In this case, the metal that covers the side faces of the core-multishell nanowire, and that is used to form the ohmic contact electrode, is employed as the second electrode.

As previously described, since the insulator, the semi-insulating semiconductor, or metal is used to fill the spaces between the core-multishell nanowire, the overall strength of the light emitting element can be increased. Especially when the semi-insulating semiconductor or metal has been used to fill the spaces between the core-multishell nanowire, degradation of the emission characteristics and deterioration of the light emitting element, both of which are caused by Joule heating, can be suppressed.

No particular limitation is imposed on methods for embedding the core-multishell nanowire in the insulator, the semi-insulating semiconductor, or metal. In a case, for example, where the core-multishell nanowire is to be embedded in an insulating resin, a resin composite can be applied to the group IV semiconductor substrate after the surface of the core-multishell nanowire has been covered with the dielectric film. Further, in a case where the core-multishell nanowire is to be embedded in the semi-insulating semiconductor, the growth of a semi-insulating semiconductor layer is permitted across the side face of the core-multishell nanowire in the radial direction, as described for the method for forming cover layers on the side surfaces of the center nanorod. As described above, to promote the growth in the radial direction, the temperature of the substrate need only be lowered about 50 to 200° C. from the temperature at which the center nanorod was grown. Moreover, in a case where the core-multishell nanowire is to be embedded in Si or Ge, after the surface of the core-multishell nanowire is covered with the dielectric film, silane gas or germanium hydride gas, for example, may be supplied to permit the growth, in the radial direction, of Si or Ge, at 300 to 500° C. Furthermore, in a case where the core-multishell nanowire is to be embedded in the III-V compound semiconductor, the III-V compound semiconductor may be permitted to grow in the radial direction under the same conditions as those for a case where the cover layers were formed on the side surfaces of the center nanorod. In addition, in a case where the core-multishell nanowire is to be embedded in metal, metal may be deposited in the space between the core-multishell nanowire.

In a case where the core-multishell nanowire is to be embedded in either the insulator or the semi-insulating semiconductor, the degree (the area) of the removal of the dielectric film may be adjusted, so that the area where the second electrode covers the core-multishell nanowire can be adjusted. For example, in a case where the dielectric film portion that covers the upper 80% portion of the core-multishell nanowire is removed, the second electrode covers this upper 80% portion of the core-multishell nanowire. In this case, the lower 20% portion of the core-multishell nanowire is still covered with the dielectric film.

According to the light emitting element of the present invention, the upper end face of the core-multishell nanowire (especially, the upper end face of the quantum well layer) cannot be covered with a metal film (a light blocking material), and the second electrode must be connected only to the side surfaces (the fourth cover film) of the core-multishell nanowire. Therefore, in a case where the upper end face of the core-multishell nanowire has been covered with the metal film by forming the second electrode, the end face of the core-multishell nanowire is preferably exposed by mechanical polishing, etc.

By performing the above described processing, the light emitting element of the present invention can be fabricated.

According to the light emitting element fabrication method of the present invention, core-multishell nanowires can be oriented perpendicular to the surface of the substrate, and the core-multishell nanowires can be arranged at a high density (one billion wires or more/$cm^2$). Further, according to the light emitting element fabrication method of the present invention, since the center nanorod is formed without requiring a metal catalyst, the core-multishell nanowire can be produced without being affected by metal contamination, and with a high-quality crystal structure.

3. Fabrication Method for a Plurality of Light Emitting Elements

According to the fabrication method of the present invention for a light emitting element (including a laser oscillator), a plurality of light emitting elements having different emission wavelengths can be fabricated simultaneously on a single substrate.

As previously described, the light emitting element fabrication method of the present invention includes: 1) a first step of preparing a substrate; 2) a second step of forming a core-multishell nanowire; and 3) a third step of forming a first electrode and a second electrode. When in the first step the center-to-center distance for the openings formed in the insulating film and/or the size of the openings is changed, in the second step, the compositions of the center nanorod and the individual cover layers and the film thicknesses of the individual cover layers can be changed (the reason for this will be described later). When the compositions (bandgaps) of the first barrier layer, the quantum well layer, and the second barrier layer are changed, the emission wavelength of the light emitting element is changed. Therefore, when the insulating film on a single substrate is divided into two or more regions, and when the center-to-center distance of the openings and/or the size of the openings are changed for the individual regions, the emission wavelength of the light emitting element can be changed for each region.

A method for fabricating, simultaneously on a single substrate, a plurality of light emitting elements that have different emission wavelengths will now be described in more detail. Explanation will not be given for matters that overlap those already explained in "2. Fabrication method for light emitting element of the present invention."

In the first step, there is prepared a substrate that includes a group IV semiconductor substrate having the (111) surface and an insulating film that covers the (111) surface. As described above, the insulating film is divided into two or more regions. As will be described later, for changing the composition of the core-multishell nanowire (the center nanorod and the individual cover layers) and the film thicknesses of the individual cover layers for each region, the center-to-center distance of the openings and/or the size (diameter or width) of the openings are changed for individual regions of the insulating film.

In the second step, core-multishell nanowires are formed on the insulating film. More specifically, the center nanorods are permitted to grow from the (111) surface of the group IV semiconductor substrate that is exposed through the openings, and then the individual cover layers are formed on the side surfaces of each of the center nanorods. Formation of the center nanorods and the individual cover layers is performed, for example, by the MOVPE method or the MBE method. Preferably, the MOVPE method is employed to form the center nanorods and the cover layers. When the semiconductor nanowires are to be formed by the MOVPE method, a source gas containing a group III element and a source gas containing a group V element may be provided at a predetermined temperature and under a low pressure. For example, for forming an InGaAs layer, gases containing trimethylindium, trimethylgallium, and arsenic hydride may be provided.

When gases containing trimethylindium, trimethylgallium, and arsenic hydride are supplied, a thermal decomposition reaction of these gases occurs in the vicinity of the surface of the substrate, and decomposed elements (In, Ga, and As) are moved across the surface of the insulating film and are collected at the openings in the insulating film. The growth of the crystal does not occur on the area covered with the insulating film, but occurs at the portion inside the openings where the semiconductor crystal is exposed. Since the substrate is heated, the elements and the source gas in contact with the surface of the insulating film are dispersed from the substrate surface as vapor and air when a predetermined period of time has elapsed. Since a distance that In travels across the surface of the insulating film is longer than a distance that Ga travels across the surface, of the elements disposed at positions separated from the openings, a larger number of In atoms reach the openings as compared with Ga atoms. As described above, in a case wherein the center-to-center distance of the openings is large, the ratio of In is great, and a thin InGaAs layer is formed. In a case wherein the center-to-center distance of the openings is small, a distance that In travels across the surface and a distance that Ga travels across the surface are longer than the center-to-center distance of the openings, and the ratio of Ga is greater, so that a thick InGaAs layer is formed. This principle is established also for a case where the growth of another III-V compound semiconductor is performed.

As described above, since in the first step the center-to-center distance of the openings and/or the size for the openings are changed for each region, in the second step the compositions of the center nanorod and the individual cover layers and the thicknesses of the cover layers can be changed for each region.

In the third step, the first electrode and the second electrode are formed.

Through this processing, a light emitting element (including a laser oscillator) can be fabricated wherein the insulating film on the substrate is divided into two or more regions, the center-to-center distance of the openings, which are formed in the insulating film, and/or the size of the openings differ for each region, and the composition of the core-multishell nanowire also differs, depending on the region.

According to the light emitting element fabrication method of this invention, for example, a plurality of laser oscillators having different emission wavelengths can be fabricated simultaneously on a single substrate.

The light emitting element of the present invention will now be described in more detail, while referring to the drawings.

Embodiment 1

An example light emitting element of the present invention that includes an n-type silicon (111) substrate is provided for Embodiment 1.

Figure 3:
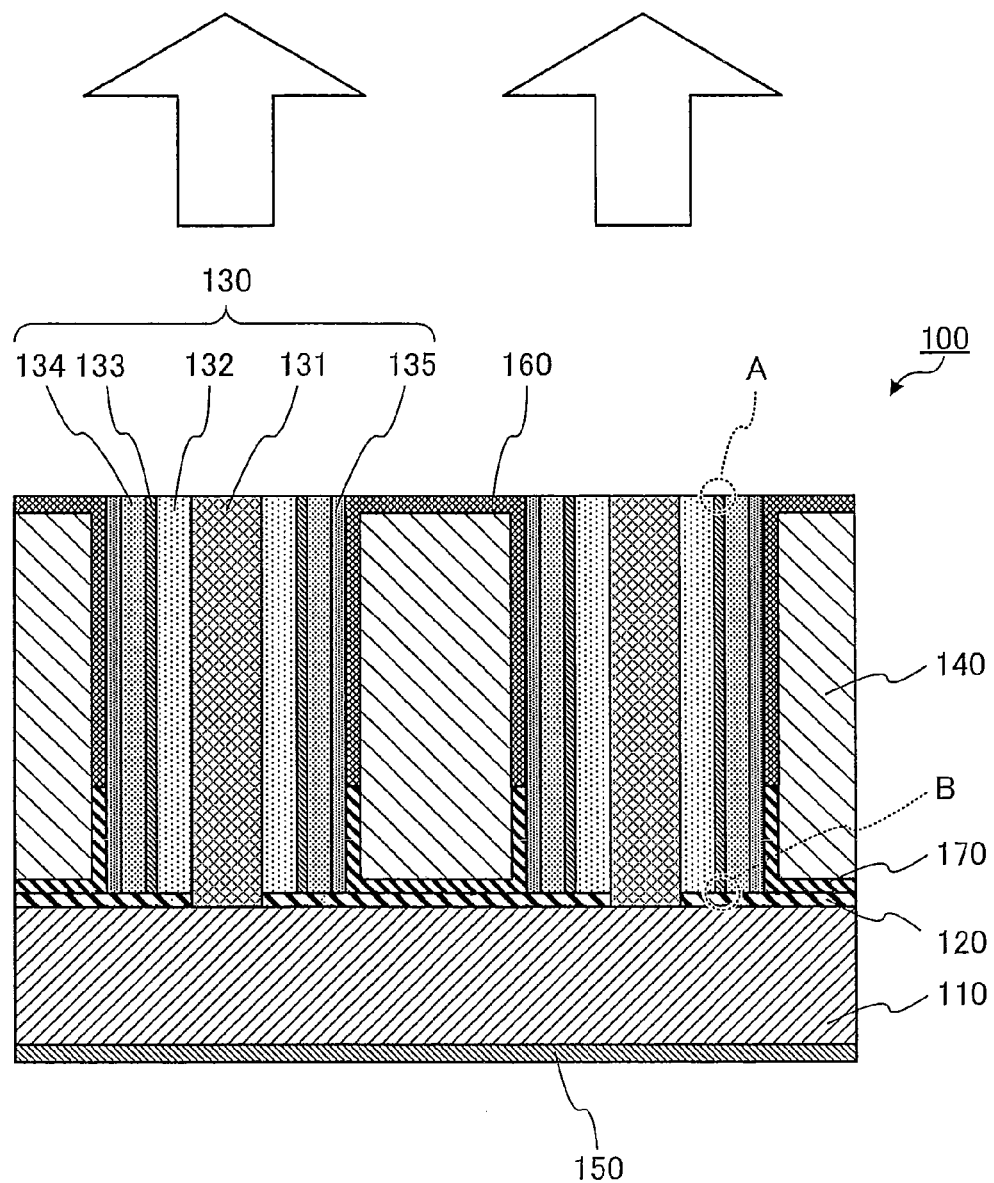
FIG. 3 is a cross-sectional view of the structure of a light emitting element according to Embodiment 1.
Figure 4:
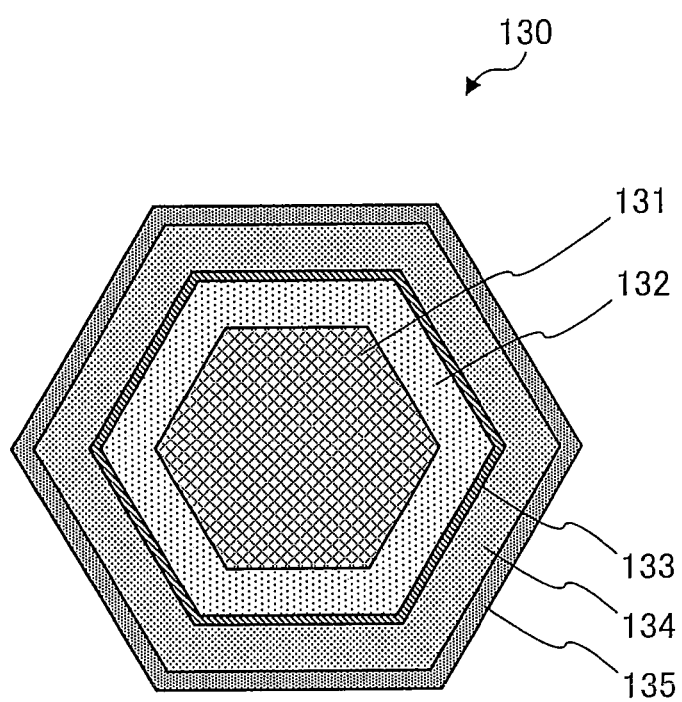
FIG. 4 is a cross-sectional view of a core-multishell nanowire for the light emitting element of Embodiment 1.

FIG. 3 is a cross-sectional view of the structure of a light emitting element of Embodiment 1. FIG. 4 is a cross-sectional view of a core-multishell nanowire for the light emitting element of Embodiment 1 (a diagram of the cross section, perpendicular to the surface of a substrate).

As shown in FIG. 3, a light emitting element 100 of Embodiment 1 includes an n-type silicon substrate 110, an insulating film 120, core-multishell nanowires 130, an insulating resin 140, a first electrode 150, a second electrode 160, and a dielectric film 170. As shown in FIG. 3 and FIG. 4, each of the core-multishell nanowires 130 includes: a center nanorod 131, formed of an n-type III-V compound semiconductor; a first barrier layer 132, formed of an n-type III-V compound semiconductor; a quantum well layer 133, formed of an i-type III-V compound semiconductor; a second barrier layer 134, formed of a p-type III-V compound semiconductor; and a capping layer 135, formed of a p-type III-V compound semiconductor. The light emitting element 100 emits light in a direction corresponding to that from the lower ends to the upper ends of the core-multishell nanowires 130 (in the direction indicated by arrows in the drawing in FIG. 3).

The n-type silicon substrate 110 is an n-type doped silicon (111) substrate.

The insulating film 120 is a film, having insulation properties, that covers the surface (the (111) surface) of the n-type silicon substrate 110 on which the core-multishell nanowires 130 are arranged. The insulating film 120 is, for example, an $SiO_2$ film having a film thickness of 20 nm. Since the n-type silicon substrate 110 and the center nanorods 131 contact each other directly, there is no insulating film 120 where the two interface.

The individual core-multishell nanowires 130 have a core-multishell structure formed of a III-V compound semiconductor. The center nanorod 131 is formed of an n-type III-V compound semiconductor (e.g., n-type GaAs), and is so located that the longitudinal axis is substantially perpendicular to the (111) surface. The first barrier layer 132 is formed of an n-type III-V compound semiconductor (e.g., n-type AlGaAs), and covers the side surfaces of the center nanorod 131. The quantum well layer 133 is formed of an i-type III-V compound semiconductor (e.g., i-type GaAs), and covers the first barrier layer 132. The second barrier layer 134 is formed of a p-type III-V compound semiconductor (e.g., p-type AlGaAs), and covers the quantum well layer 133. The capping layer 135 is formed of a p-type III-V compound semiconductor (e.g., p-type GaAs), and covers the second barrier layer 134. The first barrier layer 132, the quantum well layer 133, the second barrier layer 134, and the capping layer 135 cover only the side surfaces of the center nanorod 131, and do not cover the end faces of the center nanorod 131. Therefore, the upper end faces of the center nanorod 131, the first barrier layer 132, the quantum well layer 133, the second barrier layer 134, and the capping layer 135 are externally exposed to the atmosphere.

The insulating resin 140 is provided for the n-type silicon substrate 110 (the insulating film 120) to fill the spaces between the core-multishell nanowires 130, and electrically isolates the individual core-multishell nanowires 130. The insulating resin 140 does not directly contact the core-multishell nanowires 130, and the second electrode 160 or the dielectric film 170 is arranged between the insulating resin 140 and the core-multishell nanowires 130. No particular limitation is imposed on the material employed as the insulating resin 140, so long as a resin selected has insulation properties, but nevertheless, a transparent insulating resin is preferable. This is because light generated inside the core-multishell nanowires 130 can be efficiently emitted.

The first electrode 150 is located on the n-type silicon substrate 110, and is connected to the n-type silicon substrate 110. Preferably, the first electrode 150 is connected through ohmic contact to the n-type silicon substrate 110. The first electrode 150 is, for example, a Ti/Au multilayer film, a Ti/Al multilayer film, etc.

The second electrode 160 is provided in gap between the insulating resin 140 and the core-multishell nanowires 130 and on top of the insulating resin 140. The second electrode 160 partially covers the side surfaces (upper portions) of the core-multishell nanowires 130, and is connected to the side surfaces (the capping layers 135) of the core-multishell nanowires 130. Preferably, that the second electrode 160 is connected through ohmic contact to the side surfaces (capping layer 135) of the core-multishell nanowires 130. The second electrode 160 is, for example, a Cr/Au multilayer film, an AuZn alloy film, etc.

The dielectric film 170 is an insulating film that covers part of the side surfaces of the core-multishell nanowires 130 (the lower portions not covered with the second electrode) and part of the insulating film 120 (the portion where the core-multishell nanowires 130 are not arranged). The dielectric film 170 is either a lamination of an $Al_2O_3$ film having a thickness of 15 nm and an $SiO_2$ film having a thickness of 50 nm, or an $SiO_2$ film having a thickness of 50 nm.

According to the light emitting element 100 of Embodiment 1, light is produced at the p-n junctions formed over the entire side surfaces of the center nanorods 131. Since the generated light is reflected by the second electrode 160, the light is emitted externally from the upper end face of the core-multishell nanowires 130, and not from the side surfaces (the white arrows shown in FIG. 3).

The light emitting element 100 of Embodiment 1 can also be operated as a laser oscillator. For this purpose, preferably, 1) a III-V compound semiconductor used to form the individual layers is selected, so that the refractive indexes for the first barrier layer 132 and the second barrier layer 134 are smaller than the refractive index of the quantum well layer 133, and 2) a III-V compound semiconductor for the quantum well layer 133 and a material for the insulating film 120 are selected, so that the upper end face (A in FIG. 3) and the lower end face (B) of the quantum well layer 133 can serve as laser cavity mirrors. With this arrangement, amplification of light can be performed by repetitively reflecting light between the upper end face (A in FIG. 3) and the lower end face (B in FIG. 3) of the quantum well layer.

A fabrication method for the light emitting element 100 of Embodiment 1 will now be described while referring to FIG. 5 through FIG. 7. FIG. 5 is a schematic diagram illustrating the process for forming the core-multishell nanowires 130. FIG. 6 is a perspective view of the substrate on which the core-multishell nanowires 130 have been formed. FIG. 7 is a schematic diagram illustrating the process for forming the first electrode 150 and the second electrode 160. In FIG. 7, the cover layers 132 to 135 of the core-multishell nanowires 130 are not shown.

Figure 5A:
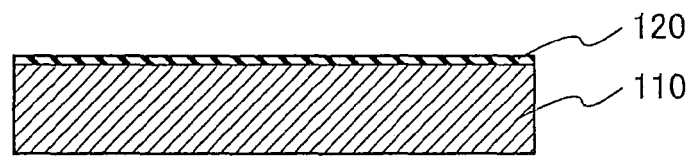
FIG. 5A, FIG. 5B, FIG. 5C, FIG. 5D are schematic diagrams showing processing for forming the core-multishell nanowires.
Figure 5B:
Figure 5C:
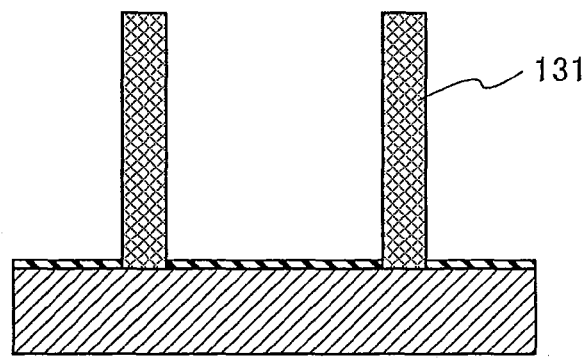
Figure 5D:
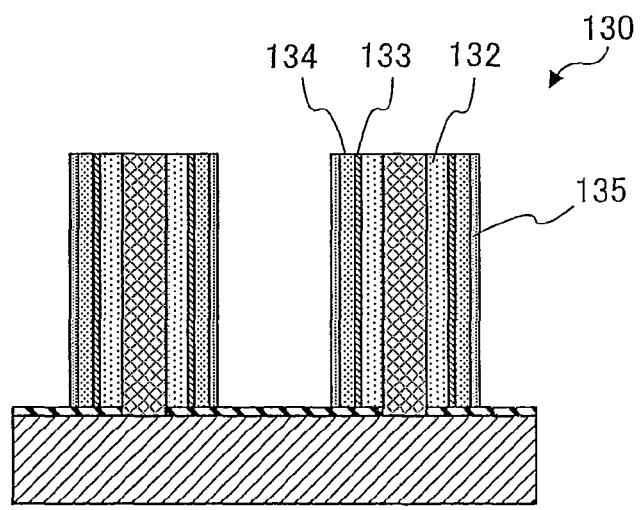
Figure 6:
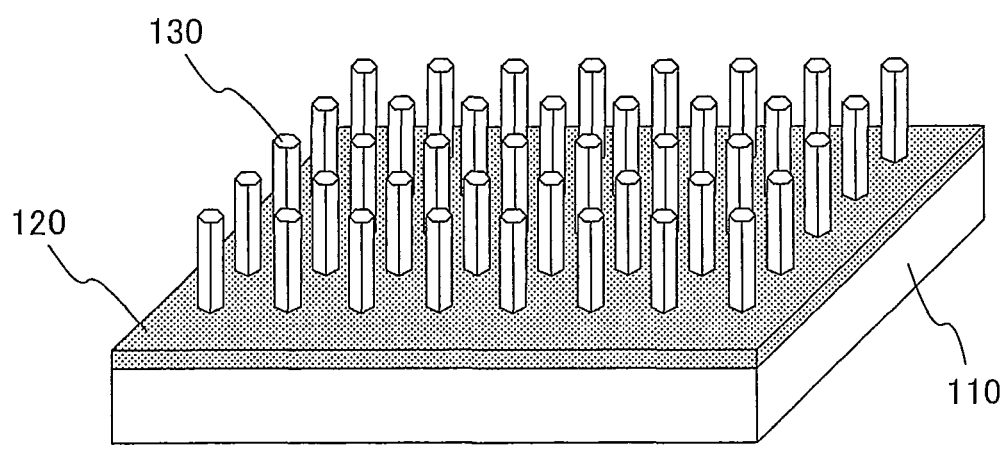
FIG. 6 is a perspective view of a substrate where the core-multishell nanowires have been formed.

First, as shown in FIG. 5A, the n-type silicon substrate 110 is prepared. On the n-type silicon substrate 110, the insulating film 120 of $SiO_2$ that has a thickness of 20 nm has been deposited by thermal oxidation. Then, as shown in FIG. 5B, photolithography, etc., is performed on the n-type silicon substrate 110, and openings are formed in the insulating film 120. Consequently, as shown in FIG. 5C, the MOVPE method is performed, and the center nanorods 131 are permitted to grow, through the openings, from the (111) surface of the n-type silicon substrate 110 that is exposed. At this time, preferably, before the growth of the center nanorods 131 is allowed, a thin III-V compound semiconductor film is formed, by using the alternate material supply modulation method, on the (111) surface of the n-type silicon substrate 110. Following this, as shown in FIG. 5D, the first barrier layer 132, the quantum well layer 133, the second barrier layer 134, and the capping layer 135 are formed on the side surfaces of each of the center nanorods 131. Through the above-described procedures, as shown in FIG. 6, the core-multishell nanowires 130 can be formed on the n-type silicon substrate 110.

Figure 7A:
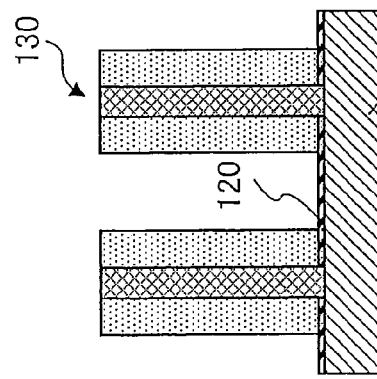
FIG. 7A, FIG. 7B, FIG. 7C, FIG. 7D, FIG. 7E, FIG. 7F, FIG. 7G, FIG. 7H are schematic diagrams showing processing for forming a first electrode and a second electrode.
Figure 7B:
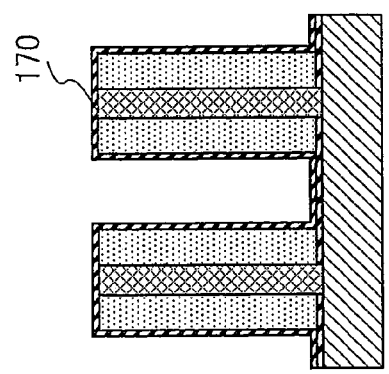

Next, as shown in FIG. 7A (the same state as shown in FIG. 5D) and FIG. 7B, the core-multishell nanowires 130 are surrounded and covered by the dielectric film 170. For example, an $Al_2O_3$ film having a thickness of 15 nm can be formed by the ALD method, and thereafter, an $SiO_2$ film having a thickness of 50 nm can be formed by sputtering. An $Al_2O_3$ film is deposited by using the ALD method in order to protect the core-multishell nanowires 130 from being damaged while formation of an SiO$_2$ film is being performed. Therefore, so long as damage on the core-multishell nanowires 130 is prevented, deposition of an Al$_2$O$_3$ film may not be performed, and only an SiO$_2$ film may be formed by the plasma CVD method, etc. The dielectric film 170 has a function for protecting the core-multishell nanowires 130 during gas etching (see FIG. 7D), and a function for obtaining a gap between the core-multishell nanowires 130 and the insulating resin 140 to form the second electrode 160 (see FIG. 7E).

Figure 7C:
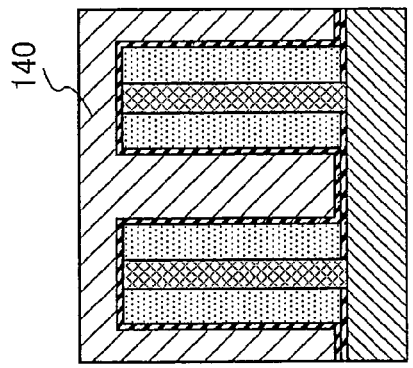
Figure 7D:
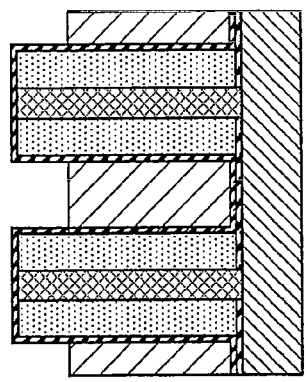
Figure 7E:
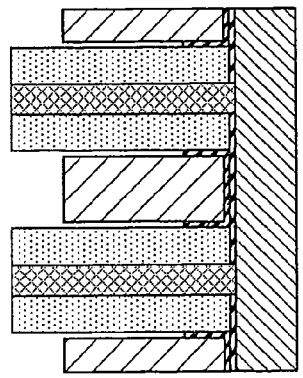

Consequently, as shown in FIG. 7C, the core-multishell nanowires 130 covered with the dielectric film 170 are embedded in the insulating resin 140. Then, as shown in FIG. 7D, the insulating resin 140 is partially removed by gas etching, etc., to expose the tip portions of the core-multishell nanowires 130. Thereafter, as shown in FIG. 7E, wet etching, etc., is performed to selectively remove the dialectic film 170 around the core-multishell nanowires 130, and the upper end faces and side surfaces of the core-multishell nanowires 130 are exposed. When the etching period is adjusted, an arbitrary area over which the side surfaces of the core-multishell nanowires 130 are exposed can be adjusted.

Figure 7F:
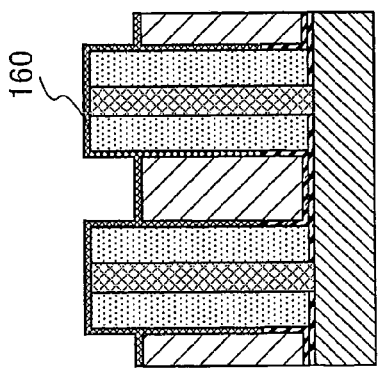
Figure 7G:
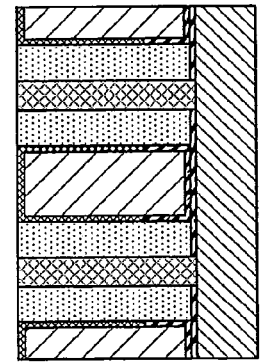
Figure 7H:
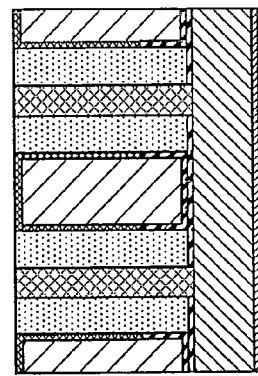

Next, as shown in FIG. 7F, metal is deposited in the gaps between the core-multishell nanowires 130 and the insulating resin 140, and the second electrode 160 is provided. In order to establish an ohmic-contact connection, annealing is preferably performed after the second electrode 160 has been formed. Thereafter, as shown in FIG. 7G, mechanical polishing is performed for the metal deposited on the core-multishell nanowires 130, together with the core-multishell nanowires 130, to expose the upper end faces of the core-multishell nanowires 130. As a result, the second electrode 160 covers only the side surfaces of the core-multishell nanowires 130. Finally, as shown in FIG. 7H, metal is deposited on the reverse surface of the n-type silicon substrate 110 to form the first electrode 150.

Through the above described procedures, the light emitting element 100 of Embodiment 1 can be produced.

Since for the light emitting element of Embodiment 1, 1) the nanowires are arranged on the (111) surface of the group IV semiconductor substrate, 2) the individual nanowires have a core-multishell structure, and 3) the side surfaces of the nanowires are covered within a metal electrode (the second electrode), both provision of high luminescence and reduction of power consumption, which cannot be achieved by the conventional semiconductor light emitting element, can be established.

Embodiment 2

An example light emitting element for the present invention that has a p-type silicon (111) substrate is provided for Embodiment 2.

Figure 8A:
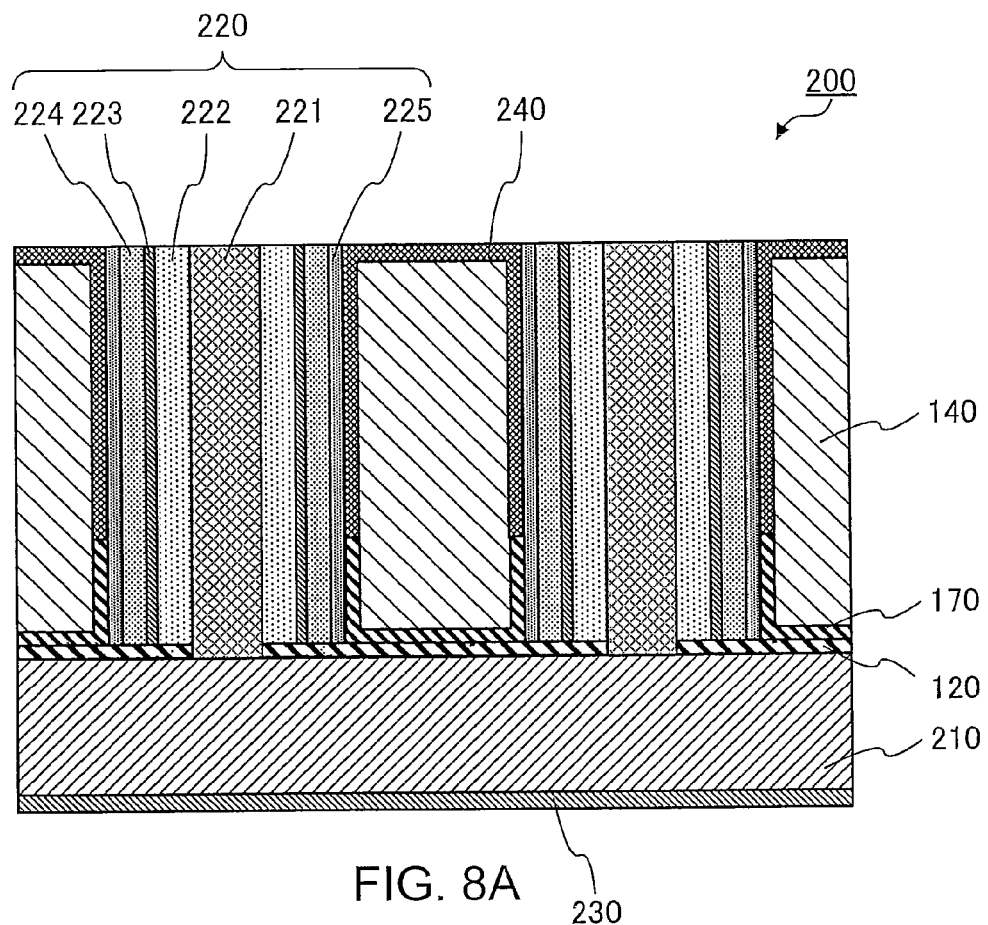
FIG. 8A is a cross-sectional view of the structure of a light emitting element according to Embodiment 2.
Figure 8B:
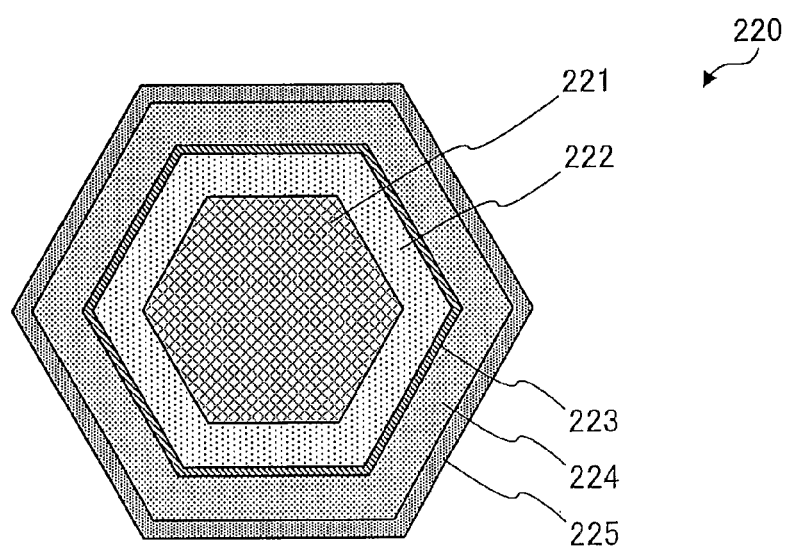
FIG. 8B is a cross-sectional view of a core-multishell nanowire for the light emitting element of Embodiment 2.

FIG. 8A is a cross-sectional view of the structure of a light emitting element for Embodiment 2. FIG. 8B is a cross-sectional view (a diagram for a cross section parallel to the surface of the substrate) of a core-multishell nanowire for the light emitting element of Embodiment 2. The same reference numerals as used for the light emitting element of Embodiment 1 are provided for the corresponding components, and an explanation for the overlapping portions will not be given.

As shown in FIG. 8A, a light emitting element 200 of Embodiment 2 includes a p-type silicon substrate 210, an insulating film 120, core-multishell nanowires 220, an insulating resin 140, a first electrode 230, a second electrode 240, and a dielectric film 170. As shown in FIG. 8A and FIG. 8B, each of the core-multishell nanowires 220 includes a center nanorod 221 formed of a p-type III-V compound semiconductor 221, a first barrier layer 222 formed of a p-type III-V compound semiconductor, a quantum well layer 223 formed of an i-type III-V compound semiconductor, a second barrier layer 224 formed of an n-type III-V compound semiconductor, and a capping layer 225 formed of an n-type III-V compound semiconductor.

The p-type silicon substrate 210 is a p-type doped silicon (111) substrate.

The core-multishell nanowires 220 are nanowires having a core-multishell structure formed of a III-V compound semiconductor. The core-multishell nanowire 220 for the light emitting element 200 of Embodiment 2 is the same as that for the light emitting element of Embodiment 1, except that the conductivity types of the individual components are opposite. That is, the center nanorod 221 is formed of a p-type III-V compound semiconductor (e.g., p-type GaAs). The first barrier layer 222 is formed of a p-type III-V compound semiconductor (e.g., p-type AlGaAs). The quantum well layer 223 is formed of an i-type III-V compound semiconductor (e.g., i-type GaAs). The second barrier layer 224 is formed of an n-type III-V compound semiconductor (e.g., n-type AlGaAs). The capping layer 225 is formed of an n-type III-V compound semiconductor (e.g., n-type GaAs).

The first electrode 230 is arranged on the p-type silicon substrate 210, and is connected to the p-type silicon substrate 210. The first electrode 230 is preferably connected through ohmic contact to the p-type silicon substrate 210. The first electrode 230 is, for example, a Cr/Au multilayer film, an AuZn alloy film, etc.

The second electrode 240 is arranged in the gaps between the insulating resin 140 and the core-multishell nanowires 220 and on the top of the insulating resin 140. The second electrode 240 partially covers the side surfaces of the core-multishell nanowires 220, and is connected to the side surfaces (capping layers 225) of the core-multishell nanowires 220. Preferably, the second electrode 240 is connected through ohmic contact to the side surfaces (the capping layers 225) of the core-multishell nanowires 220. The second electrode 240 is, for example, a Ti/Au multilayer film, a Ti/Al multilayer film, etc.

The light emitting element 200 of Embodiment 2 can be produced through the same procedures as performed for the light emitting element 100 of Embodiment 1.

With the light emitting element of Embodiment 2, as with the light emitting element of Embodiment 1, provision of high luminescence and low power consumption can be established.

Embodiment 3

An example light emitting element of the present invention wherein spaces between core-multishell nanowires are filled with a semi-insulating semiconductor is provided in Embodiment 3.

Figure 9:
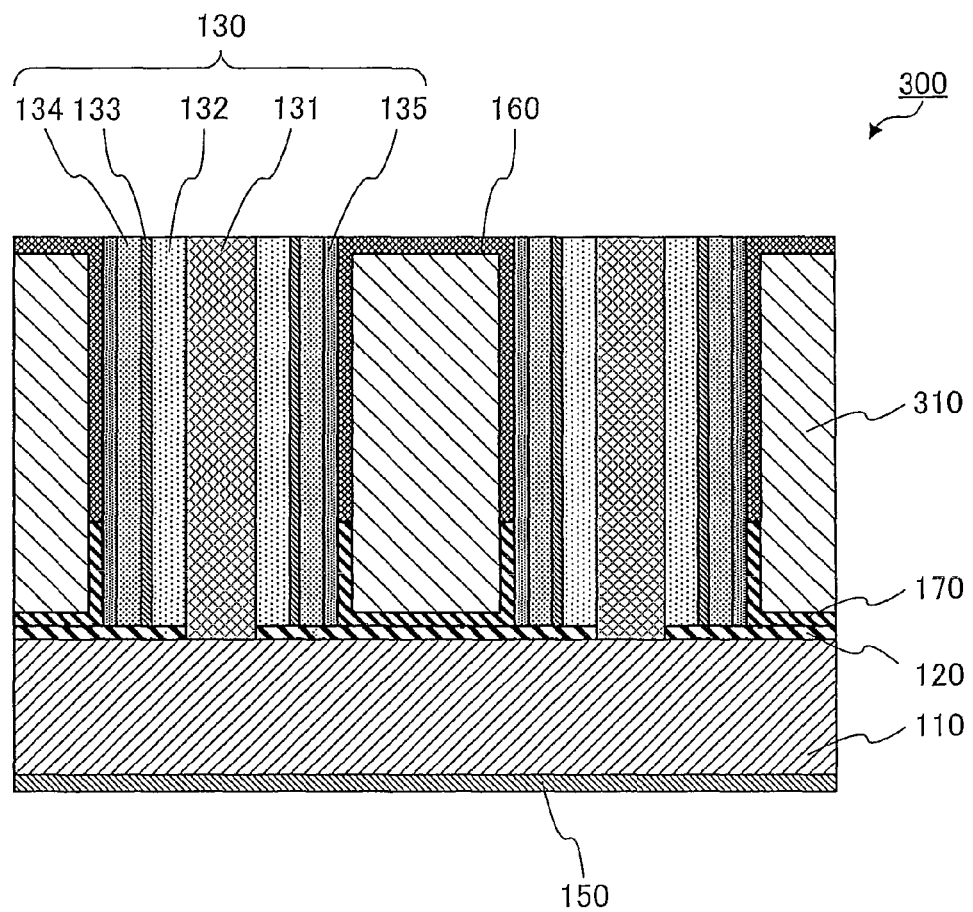
FIG. 9 is a cross-sectional view of the structure of a light emitting element for Embodiment 3.

FIG. 9 is a cross-sectional view of the structure of a light emitting element for Embodiment 3. The same reference numerals as used for the light emitting element of Embodiment 1 are provided for the corresponding components, and an explanation for the overlapping portions will not be given.

As shown in FIG. 9, a light emitting element 300 for Embodiment 3 includes an n-type silicon substrate 110, an insulating film 120, core-multishell nanowires 130, a semi-insulating semiconductor 310, a first electrode 150, a second electrode 160, and a dielectric film 170. As shown in FIG. 9, each of the core-multishell nanowires 130 includes: a center nanorod 131, formed of an n-type III-V compound semiconductor; a first barrier layer 132, formed of an n-type III-V compound semiconductor; a quantum well layer 133, formed of an i-type III-V compound semiconductor; a second barrier layer 134, formed of a p-type III-V compound semiconductor; and a capping layer 135, formed of a p-type III-V compound semiconductor.

The semi-insulating semiconductor 310 is arranged for the n-type silicon substrate 110 (the insulating film) to fill the spaces between the core-multishell nanowires 130, and electrically isolates the individual core-multishell nanowires 130. The semi-insulating semiconductor 310 does not directly contact the core-multishell nanowires 130, and the second electrode 160 or the dielectric film 170 is arranged between the semi-insulating semiconductor 310 and the core-multishell nanowires 130. Examples of the semi-insulating semiconductor 310 include undoped Si or Ge and an undoped III-V compound semiconductor.

A fabrication method for the light emitting element 300 of Embodiment 3 will now be described while referring to FIG. 10. Since the processing until formation of the core-multishell nanowires 130 is the same as that for Embodiment 1 (see FIG. 5 through FIG. 7B), an explanation for this will not be given.

Figure 10D:
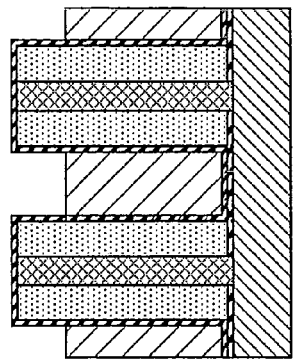
FIG. 10A, FIG. 10B, FIG. 10C, FIG. 10D, FIG. 10E, FIG. 10F, FIG. 10G, FIG. 10H are schematic diagrams showing processing for fabricating the light emitting element of Embodiment 3.
Figure 10H:
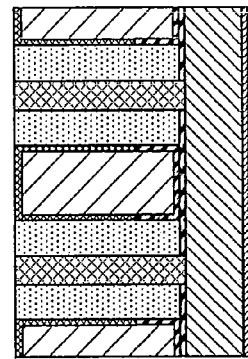
Figure 10C:
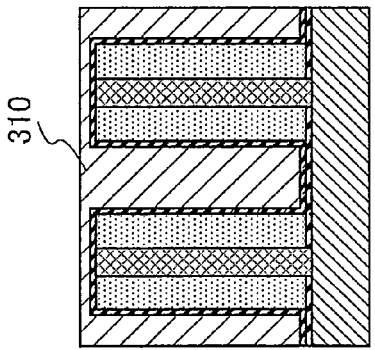
Figure 10G:
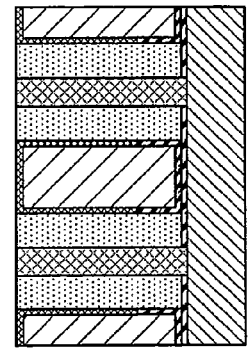
Figure 10B:
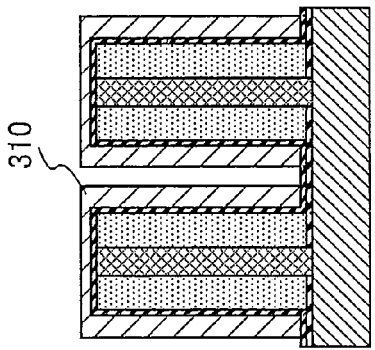
Figure 10F:
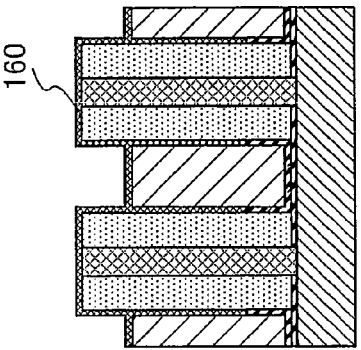
Figure 10A:
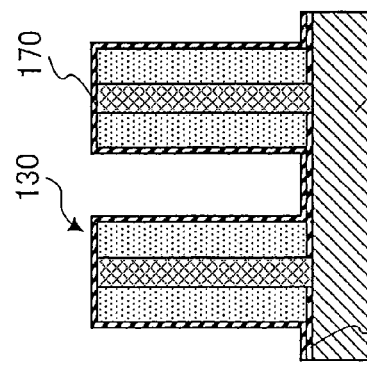
Figure 10E:
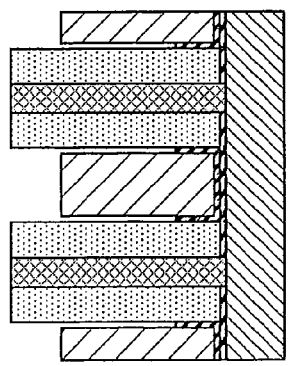

As shown in FIG. 10A, the surfaces of the core-multishell nanowires 130 are covered with the dielectric film 170, and as shown in FIG. 10B and FIG. 10C, the semi-insulating semiconductor 310 is permitted to grow in the radial direction. Thus, the spaces between the core-multishell nanowires 130 are filled with the semi-insulating semiconductor 310. Then, as shown in FIG. 10D, the semi-insulating semiconductor 310 is partially removed by gas etching, etc., to expose the tip portions of the core-multishell nanowires 130. Following this, as shown in FIG. 10E, wet etching, etc., is performed to selectively remove the dielectric film 170 around the core-multishell nanowires 130, and the upper end faces and the side surfaces of the core-multishell nanowires are exposed. When the etching period is adjusted, the area over which the side surfaces of the core-multishell nanowires 130 are exposed can be arbitrarily adjusted.

Next, as shown in FIG. 10F, metal is deposited in the gaps between the core-multishell nanowires 130 and the semi-insulating semiconductor 310 to form the second electrode 160. In order to establish an ohmic-contact connection, annealing is preferably performed after the second electrode 160 has been formed. Consequently, as shown in FIG. 10G, the metal deposited on the core-multishell nanowires 130 is mechanically polished, together with the core-multishell nanowires 130, to expose the upper end faces of the core-multishell nanowires 130. As a result, the second electrode 160 covers only the side surfaces of the core-multishell nanowires. Finally, as shown in FIG. 10H, metal is deposited on the reverse surface of the n-type silicon substrate 110 to form the first electrode 150.

Through the above described processing, the light emitting element 300 of Embodiment 3 can be produced.

With the light emitting element of Embodiment 3, as with the light emitting element of Embodiment 1, provision of high luminescence and low power consumption can be established. Further, since the light emitting element of Embodiment 3 is superior in heat dissipation, degradation of the emission characteristics and the deterioration of the light emitting element, both of which are caused by Joule heating, can also be suppressed.

Examples for the present invention will now be described in detail; it should be noted, however, that the present invention is not limited to these examples.

EXAMPLES

Example 1

1. Fabrication of a Light Emitting Element
(1) Preparation of a Substrate

An $SiO_2$ film (an insulating film) having a thickness of 20 nm was deposited, through thermal oxidation, on the surface of an n-silicon (111) substrate (see FIG. 5A). Openings were formed, with a periodicity, in the $SiO_2$ film by e-beam lithography and wet-chemical etching, and the (111) surface of the silicon substrate was exposed (see FIG. 5B). A hexagonal shape was employed for the opening, and the width of the openings was set at 100 nm. The center-to-center distance of the openings was set at 400 nm.

(2) Fabrication of Core-Multishell Nanowires

The silicon substrate on which the insulating film was formed was set in a horizontal low-pressure MOVPE reactor (HR2339: by Taiyo Nippon Sanso Corporation). The temperature of the silicon substrate was raised to 925° C., which was then maintained for five minutes, thereby removing a natural oxide film that had been deposited on the surface portions of the silicon substrate exposed to the openings. Thereafter, the temperature of the silicon substrate was lowered from 925° C. to 400° C. Further, an arsenic hydride gas was supplied together with a hydrogen gas (carrier gas). The partial pressure of arsenic hydride was set at $1.3 \times 10^{-4}$ atm.

Following this, a thin GaAs film was formed, by the alternate material supply modulation method, on the surface portions of the silicon substrate inside the openings. In this process, trimethylgallium gas and arsenic hydride gas were alternately supplied. Specifically, a set consisting of supply of trimethylgallium gas for two seconds, followed by supply of hydrogen gas for one second, and supply of arsenic hydride gas for two seconds, followed by supply of hydrogen gas for one second, was employed as one cycle, and thirty cycles were performed over three minutes, while the temperature of the silicon substrate was being increased from 400° C. to 750° C. The partial pressure of trimethylgallium was set at $1.0 \times 10^{-6}$ atm, and the partial pressure of arsenic hydride was set at $2.5 \times 10^{-4}$ atm.

Consequently, growth of n-type GaAs nanorods (center nanorods) was promoted from the surface of the silicon substrate through the openings (see FIG. 5C). Specifically, while the temperature of the silicon substrate was maintained at 750° C., trimethylgallium gas, arsenic hydride gas, and monosilane gas were supplied together with hydrogen gas to promote the growth of GaAs nanowires having a width of 100 nm through the openings from the surface of the silicon substrate. The partial pressure of trimethylgallium was set at $2.5 \times 10^{-6}$ atm, and the partial pressure of arsenic hydride was set at $1.0 \times 10^{-4}$ atm. The carrier density of the n-type GaAs nanowires was set within a range of $7 \times 10^{17}$ to $2.0 \times 10^{18}$ cm$^{-3}$.

Thereafter, an n-type AlGaAs layer (the first barrier layer), a p-type GaAs layer (a quantum well layer), a p-type AlGaAs layer (the second barrier layer), and a p-type GaAs layer (a capping layer) were formed, in the named order, around (mainly on the side surfaces) of each n-type GaAs nanowire (each center nanorod) (see FIG. 5D). Specifically, while the silicon substrate was set at the temperature of 700° C., trimethylaluminum gas, trimethylgallium gas, arsenic hydride gas, and monosilane gas were supplied together with hydrogen gas, and an n-type AlGaAs layer (the first barrier layer) having a thickness of 22 nm was formed on the side surfaces of each of the n-type GaAs nanorods (the center nanorods). Then, trimethylgallium gas, arsenic hydride gas, and dimethylzinc were supplied together with hydrogen gas, and a p-type GaAs layer (a quantum well layer) having a thickness of 3 nm was deposited on the n-type AlGaAs layer (the first barrier layer). Consequently, trimethylaluminum gas, trimethylgallium gas, arsenic hydride gas, and dimethylzinc were supplied together with hydrogen gas, and a p-type AlGaAs layer (the second barrier layer) having a thickness of 22 nm was formed on the p-type GaAs layer (the quantum well layer). Thereafter, trimethylgallium gas, arsenic hydride gas, and dimethylzinc were supplied together with hydrogen gas, and a p-type GaAs layer (a capping layer) having a thickness of 10 nm was deposited on the p-type AlGaAs layer (the second barrier layer). The partial pressure of trimethylaluminum was set at $7.5 \times 10^{-7}$ atm, the partial pressure of trimethylgallium was set at $8.2 \times 10^{-7}$ atm, and the partial pressure of arsenic hydride was set at $1.3 \times 10^{-4}$ atm. The carrier density of the n-type AlGaAs layer (the first barrier layer) was set within a range of $7 \times 10^{17}$ to $2.0 \times 10^{18}$ cm$^{-3}$, the carrier density of the p-type GaAs layer (the quantum well layer) was set at $4.8 \times 10^{18}$ cm$^{-3}$, the carrier density of the p-type AlGaAs layer (the second barrier layer) was set at $4.8 \times 10^{18}$ cm$^{-3}$, and the carrier density of the p-type GaAs layer (the capping layer) was set at $4.8 \times 10^{18}$ cm$^{-3}$.

Through this processing, the core-multishell nanowires having a length of 3 μm were formed on the surface of the silicon substrate. The density of the core-multishell nanowires on the silicon substrate is one billion wires or more/cm². The longitudinal axes of the core-multishell nanowires were substantially perpendicular to the surface of the silicon substrate.

Figure 11A:
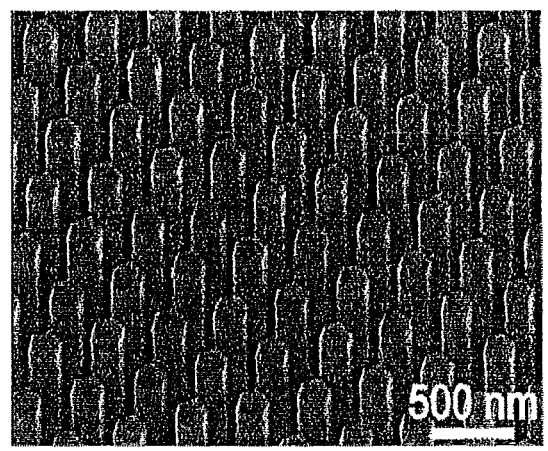
FIG. 11A is a scanning electron microscope image of a silicon substrate on which core-multishell nanowires are arranged periodically.
Figure 11B:
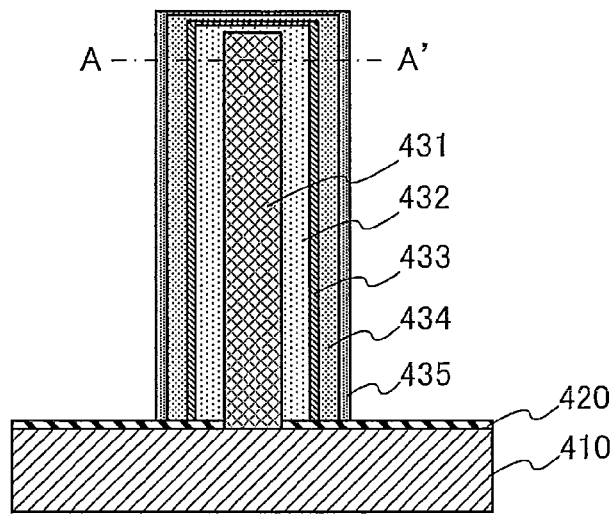
FIG. 11B is a schematic cross-sectional view of the structure of a core-multishell nanowire.
Figure 11C:
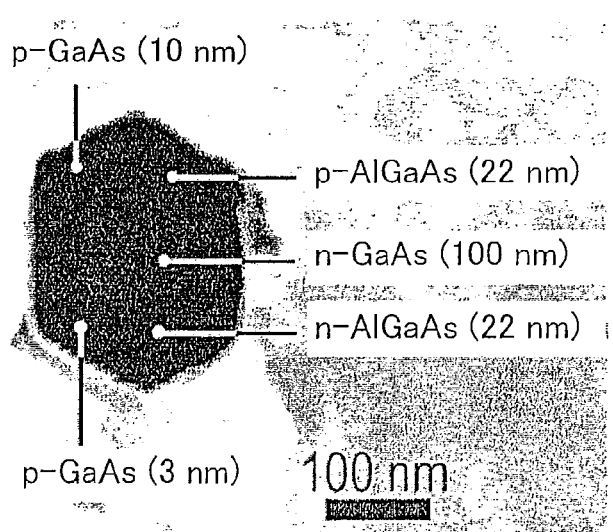
FIG. 11C is a scanning electron microscope image of the cross section of the core-multishell nanowire.

FIG. 11A is a scanning electron microscope image (a perspective image) for a silicon substrate on which core-multishell nanowires are arranged with periodicity. FIG. 11B is a schematic cross-sectional view of the structure of a core-multishell nanowire. As shown in FIG. 11B, an n-type GaAs nanorod (a center nanorod) 431 has grown from the (111) surface of an n-type silicon substrate 410 through the opening of an SiO₂ film (an insulating film) 420. An n-type AlGaAs layer (a first barrier layer) 432, a p-type GaAs layer (a quantum well layer) 433, a p-type AlGaAs layer (a second barrier layer) 434, and a p-type GaAs layer (a capping layer) 435 are laminated on the side surfaces of the n-type GaAs nanorod (the center nanorod) 431. FIG. 11C is a scanning electron microscope image showing the cross section of the core-multishell nanowire (taken along line A-A' in FIG. 11B). It is apparent from the image in FIG. 11C that the core-multishell structure shown in FIG. 11B is constructed.

(3) Fabrication of a Light Emitting Element

A dielectric film was deposited on the silicon substrate on which the core-multishell nanowires were formed (see FIG. 7B). Specifically, an Al₂O₃ film having a thickness of 15 nm was formed by the ALD method, and then an SiO₂ film having a thickness of 50 nm was deposited by sputtering.

Figure 12A:
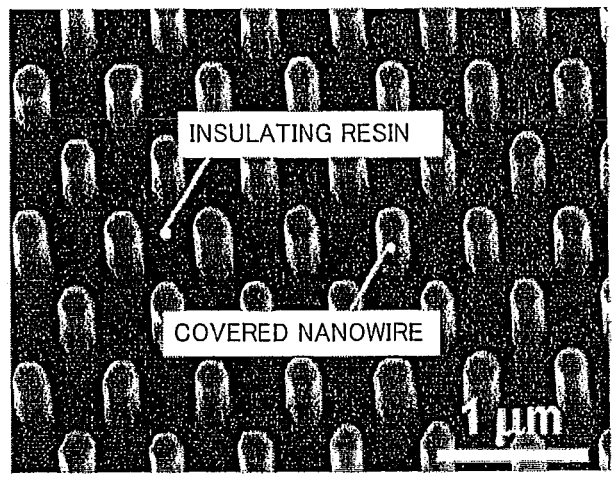
FIG. 12A is a scanning electron microscope image of the surface of the element after the tips of the core-multishell nanowires are exposed.

Following this, an insulating resin (BCB resin) film was formed on the silicon substrate on which the dielectric film was formed, and the core-multishell nanowires on the silicon substrate were embedded into the insulating resin (see FIG. 7C). Then, the upper portion of the insulating resin was removed by reactive ion etching to expose the tip portions of the core-multishell nanowires (see FIG. 7D). FIG. 12A is a scanning electron microscope image (a perspective image) of the element surface to which the tips of the core-multishell nanowires are exposed.

Consequently, wet etching was performed to selectively remove the dielectric film from the tops and part of the side surfaces (close to the top) of the core-multishell nanowires (see FIG. 7E). Specifically, wet etching was performed by immersing the silicon substrate, for two seconds, in a mixed aqueous solution of ammonium, hydrogen peroxide, and ultrapure water.

Figure 12B:
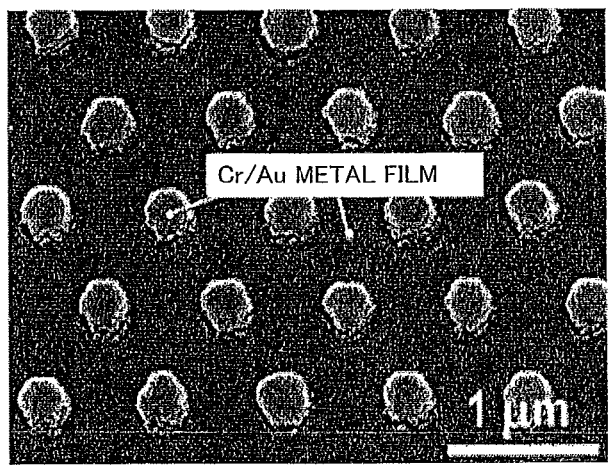
FIG. 12B is a scanning electron microscope image of the surface of the element after a Cr/Au multilayer is formed.

Thereafter, a Cr/Au multilayer film having a thickness of 150 nm was deposited as the second electrode on the surface where the core-multishell nanowires were exposed (see FIG. 7F). For formation of the second electrode, a metal vacuum evaporator that has a sample spinning mechanism was employed so that metal could efficiently enter the gaps between the core-multishell nanowires and the insulating resin. Further, in order to form an ohmic contact electrode, the resultant structure was annealed at 400° C. for five minutes in an atmosphere of nitrogen. FIG. 12B is a scanning electron microscope image (perspective image) of the element surface after a Cr/Au multilayer film was formed.

Figure 12C:
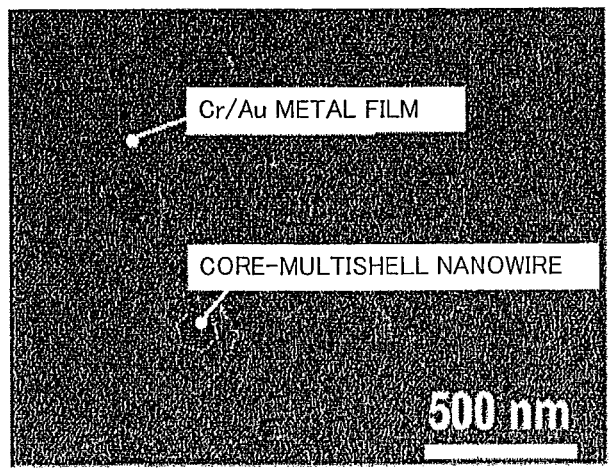
FIG. 12C is a scanning electron microscope image of the surface of the element after the tip portions of the core-multishell nanowires are polished.

Following this, the tip portions of the core-multishell nanowires, together with the Cr/Au multilayer film, were mechanically polished to expose the upper end faces of the core-multishell nanowires. FIG. 12C is a scanning electron microscope image (perspective image) of the element surface after the tips of the core-multishell nanowires were polished.

Finally, a Ti/Au multilayer film or a Ti/Al multilayer film having a thickness of 100 nm was deposited as the first electrode on the reverse surface of the silicon substrate (the surface where core-multishell nanowires are not formed) (see FIG. 7H).

Figure 13:
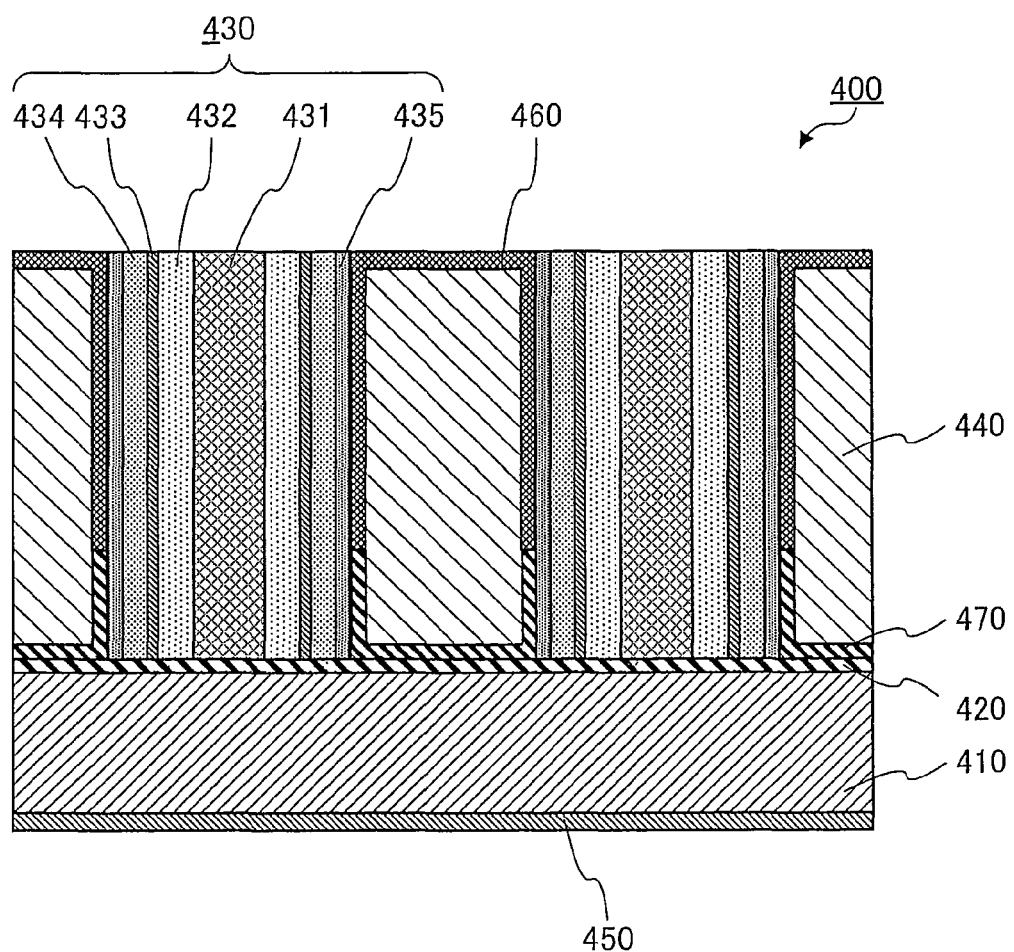
FIG. 13 is a schematic cross-sectional view of the structure of a light emitting element fabricated in an example.

FIG. 13 is a schematic cross-sectional view of the structure of the thus-produced light emitting element. As shown in FIG. 13, as for the p-type GaAs layer (the quantum well layer) 433, an interface is formed between the lower end face and the SiO₂ film 420, and an interface is formed between the upper end face and the external atmosphere (air). A dielectric film 470, an insulating resin 440, and a Cr/Au multilayer film (a second electrode) 460 are deposited on the SiO₂ film 420. The Cr/Au multilayer film (the second element) 460 is connected to the side surface of (p-type GaAs layer (capping layer) 435) of each core-multishell nanowire 430. Further, a Ti/Au multilayer film or a Ti/Al multilayer film (a first electrode) 450 is connected to the n-type silicon substrate 410.

2. Characteristics of the Obtained Light Emitting Element

Figure 14:
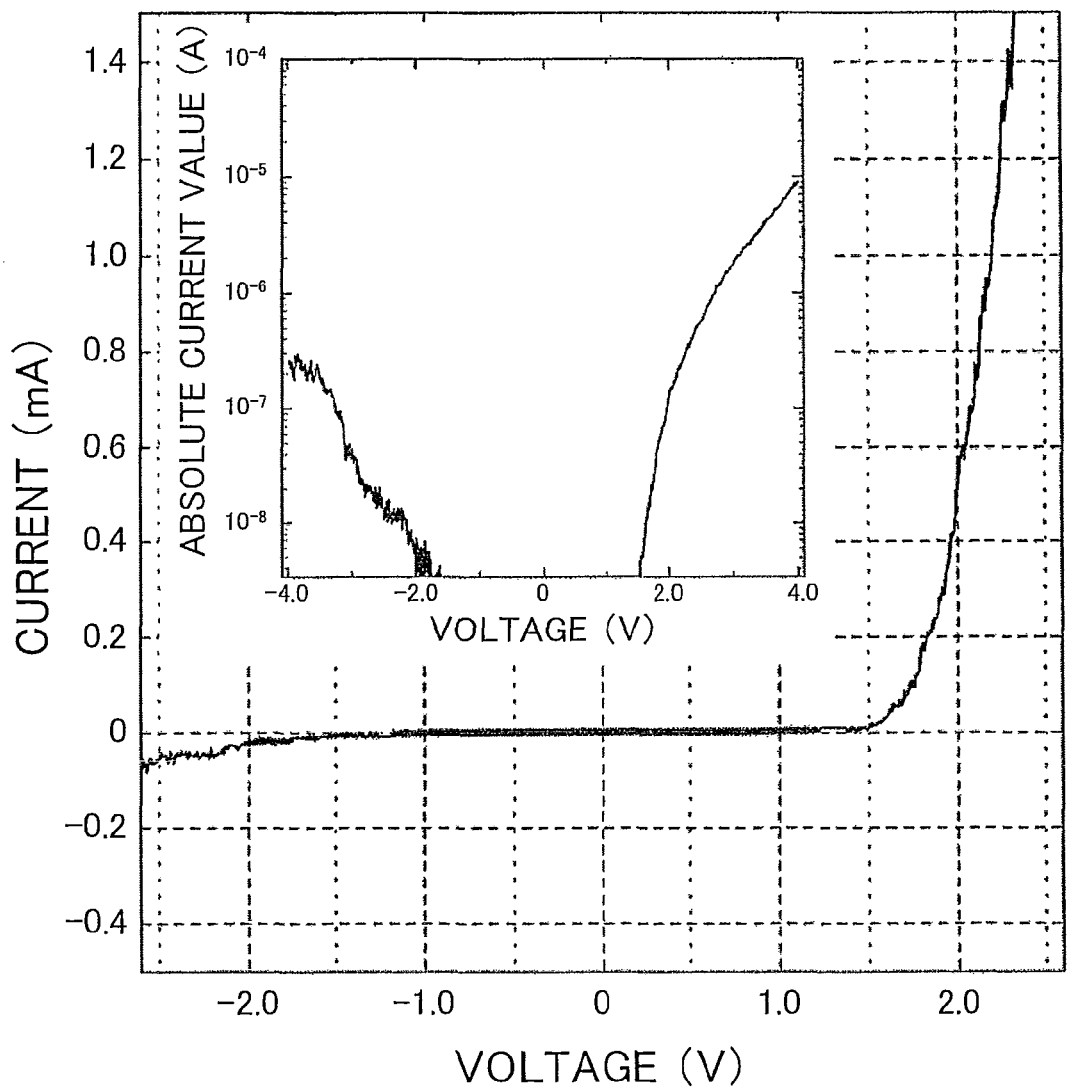
FIG. 14 is a graph showing a current-voltage curve for the light emitting element fabricated in the example.

FIG. 14 is a graph showing a current-voltage curve for the thus-produced light emitting element. An inset graph is a semilog graph obtained by conversion of the current-voltage curve. A light emitting element employed for this experiment is such that the length of core-multishell nanowires is 3 μm, and the side surfaces from the top are covered with the second electrode over a length of 2 μm. As is apparent from these graphs, the produced light emitting element is operated as a p-n junction diode having a threshold voltage of 1.4 V.

Figure 15:
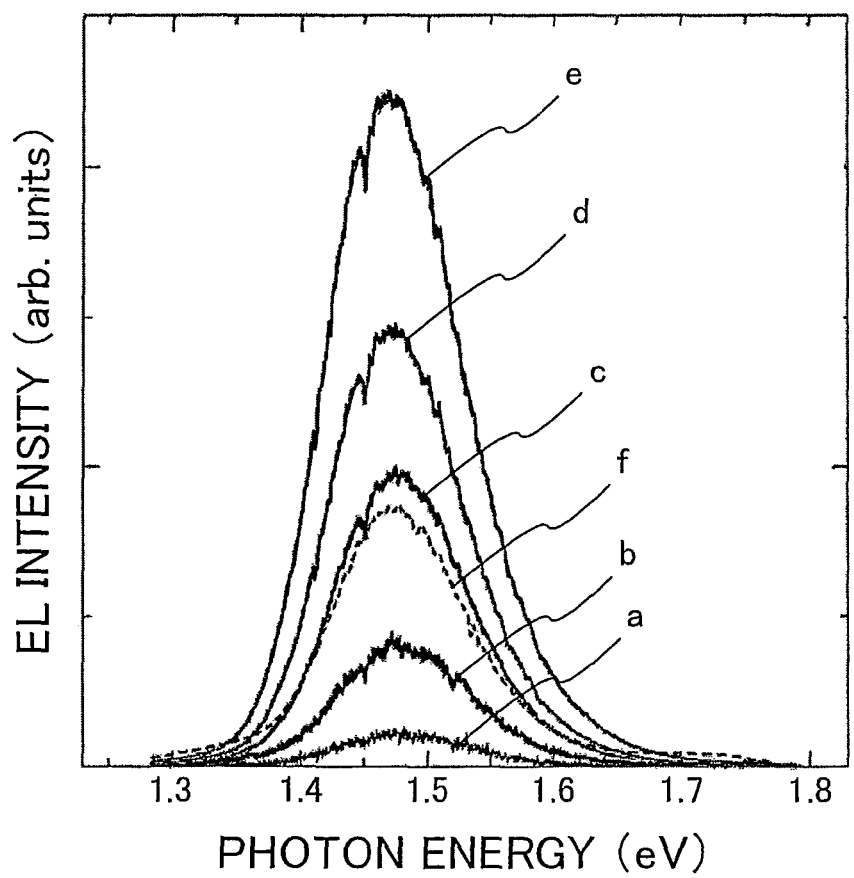
FIG. 15 is a graph showing luminescence spectrums, at current injection levels, of the light emitting element fabricated in the example.

FIG. 15 is a graph showing the luminescence spectrums of the obtained light emitting element relative to current injection (room temperature, direct-current driven). The light emitting element employed for this experiment is such that the length of core-multishell nanowires is 3 μm, and the side surfaces from the top are covered with the second electrode over a length of 2 μm. "a" indicates a luminescence spectrum (×30) at injection of a current of 0.50 mA. "b" indicates a luminescence spectrum (×20) at injection of a current of 0.65 mA. "c" indicates a luminescence spectrum (×3.0) at injection of a current of 1.30 mA. "d" indicates a luminescence spectrum (×1.5) at injection of a current of 1.84 mA. "e" indicates a luminescence spectrum at injection of a current of 4.00 mA. f indicates a photoluminescence spectrum of this structure at room temperature. As is apparent from this graph, the luminescence threshold is 0.5 mA (current density of 3.2 A/cm²) and the obtained light emitting element performs light emission with a current smaller than that acquired by a commercially available GaAs-LED.

Figure 16:
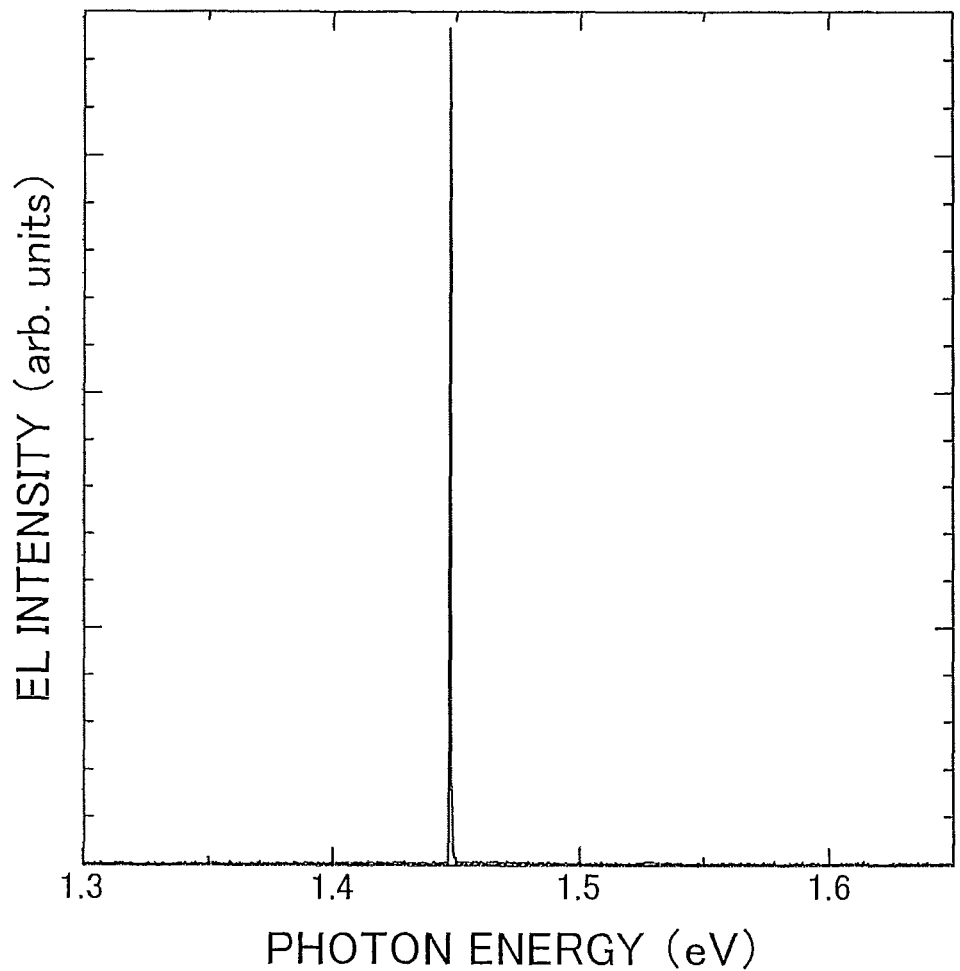
FIG. 16 is a graph showing laser oscillation spectrums of the light emitting element fabricated in the example.

FIG. 16 is a graph showing a laser oscillation spectrum of the obtained light emitting element (room temperature; direct-current driven). The light emitting element employed for this experiment is such that the length of III-V compound semiconductor nanowires is 5 µm, and the side surfaces from the top are covered with the second electrode over a length of 3 µm. The emission threshold at this time was 0.3 mA (current density of 5 A/cm$^2$). Further, an injection current at the time of laser oscillation was 46 mA (current density of 750 A/cm$^2$). As is apparent based on these results, the obtained light emitting element can also be employed as a laser oscillator.

Figure 17:
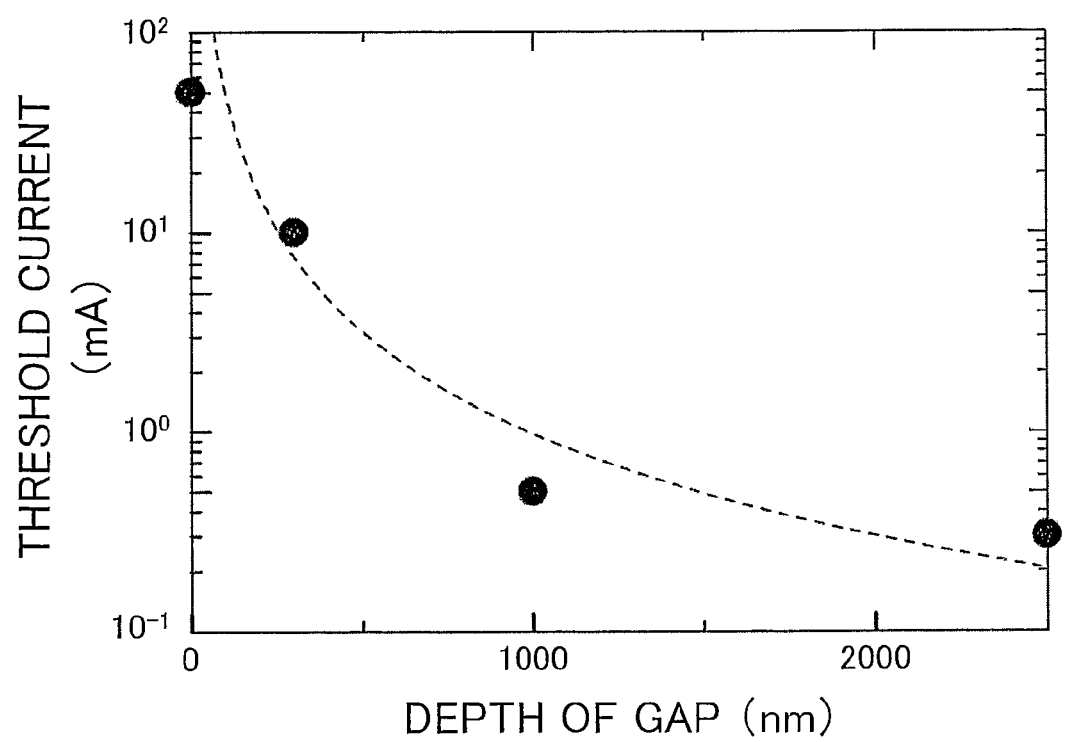
FIG. 17 is a graph showing a relationship between the depth of gap, around core-multishell nanowire formed by wet etching, and the threshold current of the light emitting element.

FIG. 17 is a graph showing a relationship between the depth of gaps around the core-multishell nanowires formed by wet etching (the length of the portions covered with the second electrode) and the threshold current of the light emitting element (room temperature; direct-current driven). The light emitting element employed for the experiment is such that the core-multishell nanowires have a length of 5 µm. As is apparent from this graph, when the depth of the gap is increased and the contact area of the second electrode becomes greater, a current level for light emission is lowered.

Example 2

In example 1, an example light emitting element has been produced wherein the spaces between the core-multishell nanowires are filled with an insulating resin (BCB). In example 2, an example light emitting element is provided wherein spaces between the core-multishell nanowires are filled with a semi-insulating semiconductor (GaAs).

(1) Preparation of a Substrate and Formation of Core-Multishell Nanowires

The same procedures as employed for example 1 were performed to form core-multishell nanowires on an n-type silicon (111) substrate (see FIG. 11).

(2) Fabrication of a Light Emitting Element

A dielectric film was deposited on the silicon substrate on which the core-multishell nanowires had been formed (see FIG. 10A). Specifically, an Al$_2$O$_3$ film having a thickness of 15 nm was formed by the ALD method, and then an SiO$_2$ film having a thickness of 50 nm was deposited by sputtering.

Figure 18:
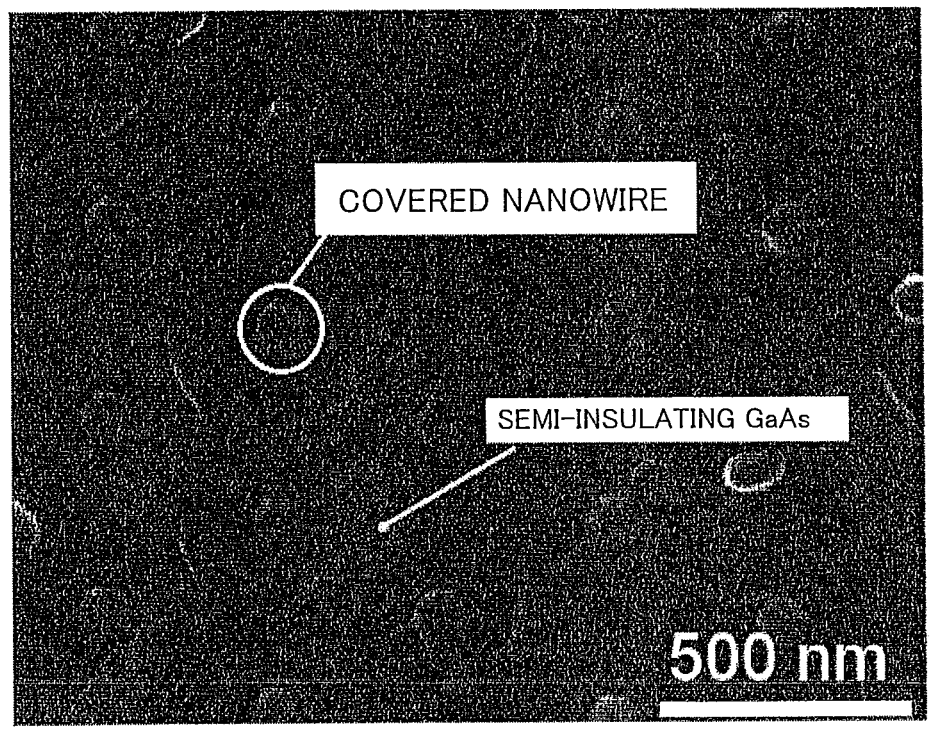
FIG. 18 is a scanning electron microscope image of the surface of the element after a semi-insulating GaAs layer is formed around the core-multishell nanowires.

Consequently, a semi-insulating GaAs layer was formed around (mainly, on the side surfaces) of the core-multishell nanowires that were covered with the dielectric layer, and the core-multishell nanowires were embedded in the semi-insulating GaAs (see FIG. 10B and FIG. 10C). Specifically, while the temperature of the silicon substrate was set at 700° C., trimethylgallium gas and arsenic hydride gas were supplied together with hydrogen gas, and a GaAs layer was deposited on the SiO$_2$ layer (dielectric film) on the side surfaces of the core-multishell nanowires. The partial pressure for trimethylgallium was set at $8.2 \times 10^{-7}$ atm, and the partial pressure for arsenic hydride was set at $1.3 \times 10^{-4}$ atm. FIG. 18 is a scanning electron microscope image of the element surface after the insulating GaAs layer was formed around (mainly, on the side surfaces) the core-multishell nanowires.

Following this, the upper portion of the insulating GaAs was removed by reactive ion etching to expose the tips of the core-multishell nanowires (see FIG. 10D).

Then, wet etching was performed, and the dielectric film was selectively removed from the tops of the core-multishell nanowires, and from part of the side surfaces (upper portions) (see FIG. 10E). Specifically, for performing etching, the silicon substrate was immersed, for two seconds, in a mixed aqueous solution of ammonium, hydrogen peroxide, and ultrapure water.

Next, a Cr/Au multilayer film having a thickness of 150 nm was deposited as a second electrode on the surface to which the core-multishell nanowires were exposed (see FIG. 10F). For formation of the second electrode, a metal vacuum evaporator that includes a sample spinning mechanism was employed, so that metal could efficiently enter the gaps between the core-multishell nanowires and the semi-insulating GaAs. Further, in order to form an ohmic contact electrode, the resultant structure was annealed at 400° C. for five minutes in an atmosphere of nitrogen.

Consequently, the tip portions of the core-multishell nanowires, together with the Cr/Au multilayer film, were mechanically polished to expose the upper end faces of the core-multishell nanowires.

Finally, a Ti/Au multilayer film or a Ti/Al multilayer film having a thickness of 100 nm was deposited as a first electrode on the reverse surface of the silicon substrate (the surface where core-multishell nanowires are not formed) (see FIG. 10H).

As described above, FIG. 18 is a scanning electron microscope image of the element surface after the semi-insulating GaAs layer was formed around (mainly, on the side surfaces) of the core-multishell nanowires. As is apparent from this image, for the light emitting element in example 2, the spaces between the core-multishell nanowires are filled with the semi-insulating semiconductor (GaAs).

Priority for the present invention claimed in the patent application is declared based on Japanese Patent Application No. 2009-273561, filed on Dec. 1, 2009. All of the contents described in the description of this application and the drawings are employed as citations for the specification of the present invention.

INDUSTRIAL APPLICABILITY

The light emitting element of the present invention is useful as a light emitting semiconductor device that is employed for, for example, an image display device or illumination equipment. Furthermore, when the light emitting element of this invention is employed, optical interconnection can be provided for signal transmission between LSI chips.

REFERENCE SYMBOL LIST 100, 200: light emitting element
110, 410: n-type silicon substrate
120: insulating film
130, 220, 430: core-multishell nanowire
131, 221: center nanorod
132, 222: first barrier layer
133, 223: quantum well layer
134, 224: second barrier layer
135, 225: capping layer
140, 440: insulating resin
150, 230: first electrode
160, 240: second electrode
170, 470: dielectric film
210, 410: n-type silicon substrate
310: semi-insulating semiconductor
420: SiO$_2$ film
431: n-type GaAs nanowire
432: n-type AlGaAs layer
433: p-type GaAs layer
434: p-type AlGaAs layer 435: p-type GaAs layer
450: Ti/Au multilayer film or Ti/Al multilayer film
460: Cr/Au multilayer film

The invention claimed is:

1. A light emitting element comprising:
a group IV semiconductor substrate that has a (111) surface and is doped with a first conductivity type;
an insulating film, which has a plurality of openings, and covers the (111) surface of the group IV semiconductor substrate;
a plurality of core-multishell nanowires, formed of III-V compound semiconductors and arranged on the insulating film;
a first electrode connected to the group IV semiconductor substrate; and
a second electrode, connected to the side surfaces of the core multishell nanowires, for covering the side surfaces of the core-multishell nanowires,
wherein each of the core-multishell nanowires includes
a center nanorod, formed using a III-V compound semiconductor of the first conductivity type and extended upward from the (111) surface of the group IV semiconductor substrate through one of the openings,
a first barrier layer, formed using a III-V compound semiconductor of the first conductivity type that has a bandgap greater than that of the III-V compound semiconductor used to form the center nanorod, for covering the side surfaces of the center nanorods on the insulating film;
a quantum well layer, formed using a III-V compound semiconductor that has a bandgap smaller than that of the III-V compound semiconductor used to form the first barrier layer, for covering the first barrier layer;
a second barrier layer, formed using a III-V compound semiconductor of a second conductivity type, which differs from the first conductivity type, that has the same composition as the III-V compound semiconductor used to form the first barrier layer, for covering the quantum well layer, and
a capping layer, which has a layer formed of a III-V compound semiconductor of the second conductivity type, and covers the second barrier layer to enable a connection to the second electrode by ohmic contact,
wherein, in the plurality of core-multishell nanowires, a gap between the side surfaces of the adjacent core-multishell nanowires is filled with the second electrode for covering the side surfaces of the adjacent core-multishell nanowires and an insulator or a semi-insulating semiconductor located between the second electrodes.

2. The light emitting element according to claim 1, wherein a longitudinal axis of the center nanorod is substantially perpendicular to the (111) surface of the group IV semiconductor substrate.

3. The light emitting element according to claim 1,
wherein the III-V compound semiconductor, used to form the first barrier layer and the second barrier layer, is either a ternary compound semiconductor or a quaternary compound semiconductor;
wherein the composition of a group III element or a group V element included in the first barrier layer is gradually changed along the direction from the center nanorod to the quantum well layer, so that a bandgap gradually becomes smaller along the direction from the center nanorod to the quantum well layer, while the composition of a group III element or a group V element included in the second barrier layer is gradually changed along the direction from the capping layer to the quantum well layer, so that a bandgap gradually becomes smaller along the direction from the capping layer to the quantum well layer.

4. The light emitting element according to claim 1, wherein:
the second electrode covers the entire circumference of the core-multishell nanowires in the circumferential direction; and
a percentage of length along a longitudinal axis covered by the second electrode, relative to the total length of the longitudinal axis of the core-multishell nanowires, is within a range of 10 to 100%.

5. The light emitting element according to claim 1, wherein the core-multishell nanowires are arranged in a proportion of at least one billion lines in every 1 $cm^2$ of the surface of the group IV semiconductor substrate.

6. The light emitting element according to claim 1,
wherein a refractive index of the III-V compound semiconductors, used to form the first barrier layer and the second barrier layer, is smaller than that of the III-V compound semiconductor used to form the quantum well layer;
wherein the insulating film includes a totally reflecting insulating film;
wherein, of two end faces of both ends of the longitudinal axis of each core-multishell nanowire, an end face that does not contact the insulating film is either exposed externally to the atmosphere or is covered with a partially reflecting insulating film;
wherein, of two end faces of the quantum well layer, an end face that contacts the insulating film provides an interface with the totally reflecting insulating film that is included in the insulating film; and
wherein, of the two end faces of the quantum well layer, an end face that does not contact the insulating film is either exposed externally to the atmosphere, or forms an interface with the partially reflecting transparent insulating film that covers the end face of the core-multishell nanowire.

7. The light emitting element according to claim 6,
wherein the insulating film is divided into two or more regions, and openings are respectively formed in the two or more regions of the insulating film;
wherein a center-to-center distance or a size of openings differs, depending on the two or more regions; and
wherein compositions of the core-multishell nanowires differ in accordance with the two or more regions.

8. A fabrication method, for a light emitting element that includes a group IV semiconductor substrate and a plurality of core-multishell nanowires, formed using a III-V compound semiconductor, comprising the steps of:
preparing a substrate such that an insulating film having a plurality of openings is deposited on a group IV semiconductor substrate having a (111) surface so as to cover the (111) surface;
performing a low-temperature heat treatment for the substrate, and performing (111)1×1 reconstruction for the (111) surface;
supplying a group III material or a group V material to the substrate under a low-temperature condition, and performing surface reconstruction for the (111) surface to provide a (111)A surface or a (111)B surface;
permitting a center nanorod, formed of a III-V compound semiconductor of a first conductivity type, to grow through the opening from the (111) surface of the group IV semiconductor substrate;

depositing, on side surfaces of the center nanorod, a first barrier layer, formed of a III-V compound semiconductor of the first conductivity type that has a bandgap larger than that of the III-V compound semiconductor used to form the center nanorod;

depositing, on the first barrier layer, a quantum well layer, formed of a III-V compound semiconductor that has a bandgap smaller than that of the III-V compound semiconductor used to form the first barrier layer;

depositing a second barrier layer on the quantum well layer, using a III-V compound semiconductor of a second conductivity type, which differs from the first conductivity type, that has the same composition as the III-V compound semiconductor used to form the first barrier layer;

depositing, on the second barrier layer, a capping layer, formed of a III-V compound semiconductor of the second conductivity type, and depositing the plurality of core-multishell nanowires;

in the plurality of core-multishell nanowires, filling a space between the adjacent core-multishell nanowires with an insulator or a semi-insulating semiconductor;

for each of the plurality of core-multishell nanowires, forming a gap between the side surface of the core-multishell nanowire and the insulator or the semi-insulating semiconductor;

filling the gap with a metal material and forming a second electrode; and forming a first electrode on the group IV semiconductor substrate.

9. The fabrication method according to claim 8, further comprising, before the step of performing low-temperature heat treatment for the substrate:

a step of performing high-temperature heat treatment for the substrate to remove a natural oxide film from a surface of the group IV semiconductor substrate.

10. The fabrication method according to claim 8, further comprising a step of alternately supplying the group V material and the group III material to the (111)A surface or the (111)B surface that is obtained after performing (111)1×1 reconstruction, and forming a thin III-V compound semiconductor film.

11. The fabrication method according to claim 8, wherein the step of performing (111)1×1 reconstruction for the (111) surface and the step of performing surface reconstruction for the (111) surface to obtain the (111)A surface or the (111) surface are performed either in the named order, or simultaneously.

12. The fabrication method according to claim 8, wherein the group III material is a gas containing boron, aluminum, gallium, indium, or thallium.

13. The fabrication method according to claim 8, wherein the group V material is a gas containing nitrogen, phosphorus, arsenic, antimony, or bismuth.

14. The fabrication method according to claim 8, wherein the insulating film that covers the (111) surface is a thermal oxide film deposited on the surface of the group IV semiconductor substrate.

15. The fabrication method according to claim 8, wherein in the step of preparing the substrate, the insulating film is divided into two or more regions, and openings are respectively formed in the two or more regions of the insulating film; and wherein either a center-to-center distance or a size for the openings differs, depending on two or more regions.

* * * * *